United States Patent
Yamazaki

(10) Patent No.: US 7,446,054 B2
(45) Date of Patent: Nov. 4, 2008

(54) METHOD FOR MANUFACTURING SEMICONDUCTOR DEVICE

(75) Inventor: Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 155 days.

(21) Appl. No.: 10/573,160

(22) PCT Filed: Oct. 25, 2004

(86) PCT No.: PCT/JP2004/016175

§ 371 (c)(1),
(2), (4) Date: Mar. 23, 2006

(87) PCT Pub. No.: WO2005/041280

PCT Pub. Date: May 6, 2005

(65) Prior Publication Data

US 2007/0042597 A1    Feb. 22, 2007

(30) Foreign Application Priority Data

Oct. 28, 2003    (JP)    ............................. 2003-367051

(51) Int. Cl.
H01L 21/31    (2006.01)
(52) U.S. Cl. ..................................... 438/760
(58) Field of Classification Search ................ 438/680, 438/736, 760, 782, 942–951, 82; 257/637, 257/750, E29.284, E29.299, 37, 299
See application file for complete search history.

(56) References Cited

U.S. PATENT DOCUMENTS 5,132,248 A    7/1992    Drummond et al.
5,405,787 A * 4/1995 Kurimoto ................... 438/302
6,071,807 A    6/2000    Watanabe et al.

(Continued)

FOREIGN PATENT DOCUMENTS

JP    61-171.151    * 8/1986

(Continued)

OTHER PUBLICATIONS

International Search Report of Application No. PCT/JP2004/016175; PCT7431, Dated: Feb. 1, 2005.

(Continued)

*Primary Examiner*—Calvin Lee
(74) *Attorney, Agent, or Firm*—Nixon Peabody LLP; Jeffrey L. Costellia

(57) ABSTRACT

It is an object of the present invention to provide a method for manufacturing a semiconductor device in which prevention of disconnection due to a step caused by a surface shape before film formation, control of increase in the cost in forming an insulating film over a large-sized substrate, improvement of the usability efficiency of a material, and a reduction in the amount of waste are realized. In the invention, a first insulating film is formed by discharging a composition, a second insulating film is selectively formed over the first insulating film, and an opening is formed by etching the first insulating film by using the second insulating film as a mask. Afterwards, a conductive film is formed by discharging a composition over the opening, and a wiring in a lower layer and a wiring in an upper layer are connected each other with an insulating film therebetween.

100 Claims, 14 Drawing Sheets

U.S. PATENT DOCUMENTS

| | | |
|---|---|---|
| 6,294,401 B1 | 9/2001 | Jacobson et al. |
| 6,362,507 B1 | 3/2002 | Ogawa et al. |
| 6,420,261 B2 * | 7/2002 | Kudo .......................... 438/633 |
| 6,475,836 B1 | 11/2002 | Suzawa et al. |
| 6,514,801 B1 | 2/2003 | Yudasaka et al. |
| 6,624,071 B2 * | 9/2003 | Seki ........................... 438/681 |
| 6,713,389 B2 | 3/2004 | Speakman |
| 6,794,220 B2 | 9/2004 | Hirai et al. |
| 7,192,859 B2 | 3/2007 | Yamazaki et al. |
| 2001/0023121 A1 | 9/2001 | Meijer et al. |
| 2001/0027009 A1 | 10/2001 | Matsubara et al. |
| 2002/0070382 A1 | 6/2002 | Yamazaki et al. |
| 2003/0054653 A1 | 3/2003 | Yamazaki et al. |
| 2003/0059987 A1 | 3/2003 | Sirringhaus et al. |
| 2004/0147066 A1 | 7/2004 | Yamazaki et al. |
| 2004/0147113 A1 | 7/2004 | Yamazaki et al. |
| 2004/0253835 A1 | 12/2004 | Kawase |
| 2004/0263564 A1 | 12/2004 | Maekawa et al. |
| 2005/0072974 A1 | 4/2005 | Nakamura et al. |
| 2005/0122351 A1 | 6/2005 | Yamazaki et al. |
| 2005/0197031 A1 | 9/2005 | Yamazaki et al. |
| 2005/0206313 A1 | 9/2005 | Yamazaki et al. |
| 2005/0208863 A1 | 9/2005 | Yamazaki et al. |
| 2006/0158482 A1 | 7/2006 | Nakamura et al. |
| 2007/0164280 A1 | 7/2007 | Maekawa et al. |
| 2007/0178687 A1 | 8/2007 | Yamazaki et al. |

FOREIGN PATENT DOCUMENTS

| | | | |
|---|---|---|---|
| JP | 04-196.133 | * | 7/1992 |
| JP | 05-338187 | | 12/1993 |
| JP | 06-182980 | | 7/1994 |
| JP | 06-237063 | | 8/1994 |
| JP | 09-320363 | | 12/1997 |
| JP | 10-270843 | | 10/1998 |
| JP | 11-103069 | | 4/1999 |
| JP | 11-340129 | | 12/1999 |
| JP | 2000-323572 | | 11/2000 |
| JP | 2001-052864 | | 2/2001 |
| JP | 2002-026014 | | 1/2002 |
| JP | 2002-324966 | | 11/2002 |
| JP | 2002-359246 | | 12/2002 |
| JP | 2006-040.940 | * | 2/2006 |

OTHER PUBLICATIONS

Written Opinion (Application No. PCT/JP2004/016175; PCT7431, Dated: Feb. 1, 2005.

* cited by examiner

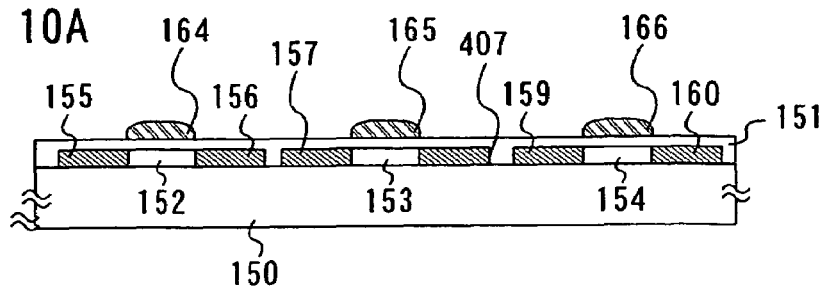
FIG. 10A
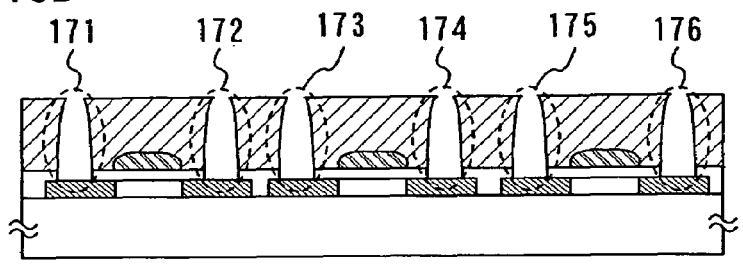
FIG. 10B
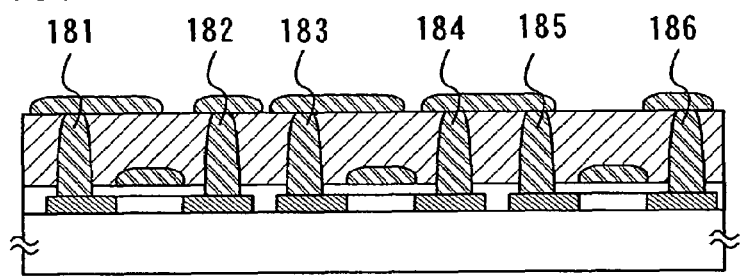
FIG. 10C
FIG. 10D
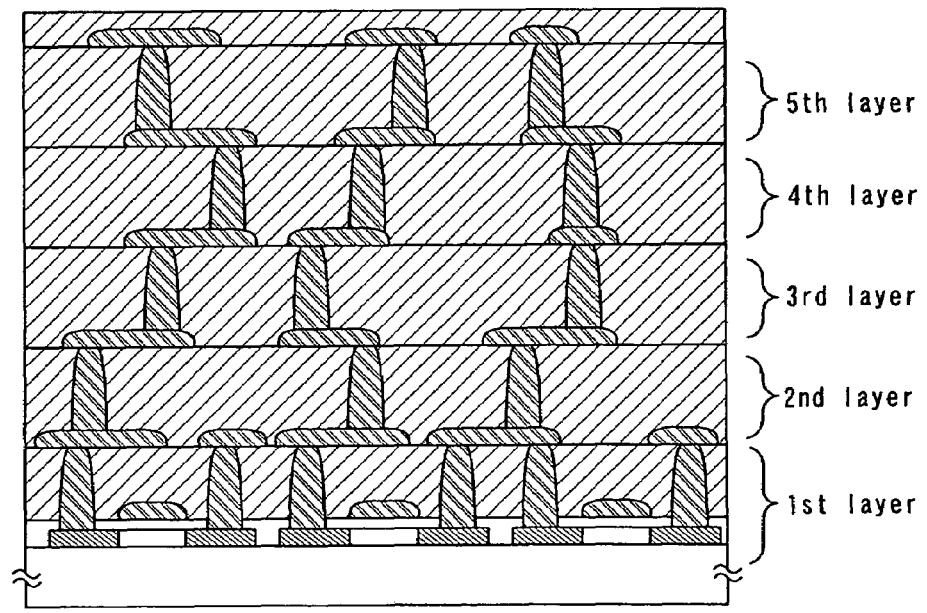

EXPLANATION OF REFERENCE

100·Substrate, 101·First insulating film, 102·Second insulating film, 103, 104·Openings, 202·Second insulating film, 203, 204·Openings, 205, 206 · Conductive films, 300 · Substrate, 301 · Insulating film, 303, 304·Openings, 400·Substrate, 401·Base insulating film, 402·Insulating film, 403·Gate electrode, 404·Semiconductor film, 405·Source, 406·Drain, 409, 410·Insulating films, 411, 412·Openings, 413, 414·Conductive films, 415·Pixel electrode, 416 · Bank, 417 · Electroluminescent layer, 418 · Conductive film, 419 · Insulating film, 420 · Substrate, 421 · Sealant, 450·Substrate, 451·Insulating film, 453, 454·Openings, 460·Barrier layer, 501·Insulating film, 505, 506·Conductive films, 520·Barrier layer, 600·Substrate, 601·Insulating film, 602·Head, 603·Abrasive cloth, 604·Abrasive liquid, 605·Wafer, 606·Molding board, 800, 825·Substrates, 801, 802·Conductive films, 803 · n-type amorphous semiconductor, 804 · Amorphous semiconductor, 805·Insulating film, 806·Gate electrode, 807·Mask, 808 · n-type amorphous semiconductor, 809 · Amorphous semiconductor, 810·Insulating film, 811, 812·Insulating films, 813, 814 · Openings, 815, 816 · Conductive films, 817 · Pixel electrode, 821, 824·Oriented films, 822·Color filter, 823·Counter electrode, 824·Substrate, 826·Liquid crystal, 827, 828·Polarizing plates, 900·Substrate, 901·Gate electrode, 902·Insulating film, 905·Amorphous semiconductor, 906, 907·n-type amorphous semiconductor, 908, 909·Conductive films, 910, 911·Insulating films, 912·Openings, 913, 914·Conductive films, 915·Anode, 916·Electroluminescent layer, 917, Cathode, 918·Bank, 920·Shielding material

METHOD FOR MANUFACTURING SEMICONDUCTOR DEVICE

TECHNICAL FIELD

The present invention relates to a method for manufacturing a semiconductor device using a droplet discharging method typified by an ink-jet method, particularly to a technique for forming an insulating film which constitutes a semiconductor device.

BACKGROUND ART

In recent years, a semiconductor device using a thin film transistor has been widely applied to a large-sized liquid crystal display device such as a television as well as a portable terminal such as a cellular phone, and also has been developed actively.

A droplet discharging method has various advantages such as no need for a mask, easy increase in the size of a substrate, high usability of a material, being possible to decrease the amount of facility investment and miniaturize the size of manufacturing apparatus. Therefore, a droplet discharging method is applied to manufacturing a wiring, an electrode and the like of a color filter or a plasma display.

In the conventional method for manufacturing a semiconductor device, a considerably complex step is used for forming a pattern of a circuit or the like. For example, a step of manufacturing a semiconductor device in which a wiring in a lower layer and a wiring in an upper layer are connected to each other with an insulating film therebetween is briefly described hereinafter.

Initially, a conductive film which is to be a base of a wiring is formed over an insulating surface, and a resist is formed over the entire surface of the insulating film by using spin coating. Subsequently, a region which is used for a wiring in the conductive film is specified, and a resist pattern is formed by light-exposure and development to form a desired wiring by selectively etching the conductive film. Then, an insulating film is formed over the wiring by CVD, sputtering, spin coating or the like, and a resist is formed over the insulating film. Then, the insulating film is selectively etched to form an opening so that the wiring in a lower layer is exposed by using the resist on which light-exposure and development treatment is performed as a mask as above. Then, a conductive film is formed to fill the opening and a resist is formed over the conductive film. Subsequently, the conductive film is etched to form a wiring in an upper layer connected to the wiring in a lower layer by using the resist on which light-exposure and development treatment is performed as a mask.

DISCLOSURE OF INVENTION

In the above-mentioned manufacturing step, the insulating film is formed by sputtering, CVD, spin coating or the like. The surface shape of the insulating film formed by sputtering or CVD depends on the surface shape before forming a film. Accordingly, when there is a step in the surface shape before film formation, there is a problem that disconnection due to a step and the like are generated, when a wiring is laminated after forming the insulating film. In addition, sputtering and CVD are vapor phase processes using vacuum apparatus. Therefore, when the insulating film is formed over a large-sized substrate having one meter or more on a side, apparatus is inevitably increased in size resulting in increase in the cost.

On the other hand, when the insulating film is formed by spin coating, the surface shape of the insulating film does not depend on the surface shape before film formation. However, when a substrate is increased in size, a film thickness becomes thicker in an end portion of the substrate compared with that of a central portion; therefore, uniformity of a film thickness of the insulating film can not be kept. In addition, in spin coating, a liquid resin is dispersed over the substrate by the centrifugal acceleration, and an extra resin is dropped from an edge of the substrate, thereby forming a thin resin film over the surface of the substrate. Therefore, usability of a material is poor and an extra resin is generated as waste.

In view of the above-mentioned actual condition, it is an object of the present invention to provide a method for manufacturing a semiconductor device in which disconnection due to a step caused by the surface shape before film formation is not generated. In addition, in the case of forming an insulating film over a large-sized substrate, it is an object to provide a method for manufacturing a semiconductor device in which apparatus increased in size is not needed, and increase in the cost is controlled. Furthermore, it is an object to provide a method for manufacturing a semiconductor device in which improvement of the usability of a material and a reduction in the amount of waste are realized.

To solve the object of the above-mentioned conventional technique, following steps are implemented in the invention.

One feature of the invention is that a first insulating film is formed by discharging a composition including an insulator, a second insulating film is formed over the first insulating film, a mask pattern is formed by performing light-exposure and development on the second insulating film, and an opening is formed by etching the first insulating film using the second insulating film as a mask. Here, although the second insulating film may be formed by using a known method such as spin coating, the insulating film can be formed with a minimum material by being formed with the use of a droplet discharging method. Note that a droplet discharging method in the invention means a method by which a droplet (also referred to as a dot) of a composition including a material of a conductive film, an insulating film or the like is selectively discharged (sprayed) to be formed in an arbitrary spot, and is also referred to as an ink-jet method depending on the method.

One feature of the invention is that in the above-mentioned structure, an insulating film which is to be a mask is formed in an arbitrary spot by selectively discharging a composition including an insulator again after forming the first insulating film. Steps of light-exposure and development become unnecessary by selectively forming the mask. A material used as the mask is not limited to the insulating film. Therefore, when a selective ratio of the etching rate can be obtained with respect to the first insulating film in etching, a conductive film may be used as a mask by discharging a composition including a conductive material and the like in stead of the second insulating film.

The invention is a method for manufacturing a semiconductor device in which an insulating film is formed by discharging a composition. As its feature, a point in which an insulating film provided with an opening is manufactured by performing etching after forming a mask over an insulating film, and further, a point in which an inert gas is added to the insulating film are given. Specifically, the inert gas is one or plural kinds selected from helium (He), neon (Ne), argon (Ar), krypton (Kr) and xenon (Xe), and one feature is that the insulating film is formed so that the inert gas is included at a concentration of from $1\times10^{19}$ atoms/cm$^3$ to $5\times10^{21}$ atoms/cm$^3$, preferably from $2\times10^{19}$ atoms/cm$^3$ to $2\times10^{21}$ atoms/cm$^3$.

One feature of the invention is that in the above-mentioned structure, the opening is formed to have a tapered shape, and specifically, the opening is formed to have a tapered shape of from 30° or more and less than 75°. Adding an inert gas to a side surface of the opening becomes easy by forming the opening to have a tapered shape.

One feature of the invention is that a barrier layer is formed by discharging a composition including a conductive material to a side surface of the formed opening. Here, a film used as the barrier layer is not limited to a conductive film, and an insulating film may be used as the barrier layer. For example, when a barrier layer is formed in a region where there is a possibility that a short circuit with a wiring may be generated, it is preferable that the barrier layer is formed from a resin material.

One feature of the insulating film of the Invention is that the insulating film is manufactured from a material in which a skeletal structure is configured by a bond of an organic material or silicon and oxygen. Here, the organic material means acrylic, polyimide, benzocyclobutene, polyamide and the like. Further, the material in which a skeletal structure is configured by the bond of silicon and oxygen means typically a compound material made from polymerization of a polymer including siloxane or the like. Specifically, a material in which a skeletal structure is configured by the bond of silicon and oxygen and at least hydrogen is contained as a substituent, or a material having at least one kind of fluorine, an alkyl group and aromatic hydrocarbon as a substituent is included.

One feature of the invention is that planarizing treatment is performed after forming an insulating film by discharging a composition. As a method of planarizing treatment, a known method may be used. Specifically, a planarizing method such as reflow planarization, CMP planarization, bias sputter planarization or etchback planarization, or a combination thereof is used to perform planarizing treatment.

One feature of the invention is that in the above-mentioned structure, a conductive film filling the opening is formed by discharging a composition including a conductive material to the opening provided in the insulating film which is formed by discharging a composition. The conductive film is formed from a material including silver, gold, copper or indium tin oxide, which is one feature of the invention.

In the invention, an insulating film is formed by discharging a composition. Therefore, it is possible to apply only a required amount of a material to an arbitrary spot with an arbitrary pitch in discharging. Therefore, a shape of the manufactured insulating film does not depend on the surface shape before film formation and disconnection due to a step in a wiring layer can be prevented. In addition, improvement of the usability of a material and reduction in the amount of waste can be achieved since only a required amount of a material is applied. In the case of forming an insulating film over a large-sized substrate, increase in the cost can be controlled since enlarged apparatus is not necessary.

BRIEF DESCRIPTION OF DRAWINGS

FIGS. 10A to 10D are diagrams to explain a method for manufacturing multi-layer wirings according to the present invention (Embodiment 4).

BEST MODE FOR CARRYING OUT THE INVENTION

Embodiment Mode 1

Figure 1A:
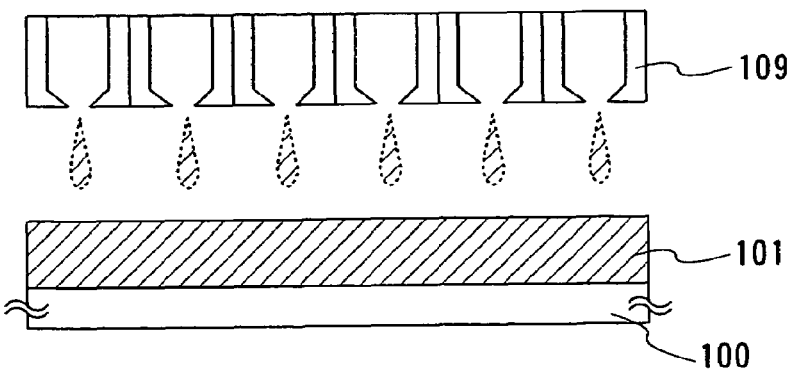
FIGS. 1A to 1E are diagrams to explain a method for manufacturing an insulating film (Embodiment Mode 1).

Embodiment mode of the present invention is described with reference to FIGS. 1A to 1E.

Initially, a first substrate 100 is prepared. A glass substrate, a quartz substrate, a semiconductor substrate, a metal substrate, a stainless-steel substrate, or a plastic substrate capable of withstanding a processing temperature of this manufacturing step is used for the substrate 100. At this time, a base film made from an insulator or a semiconductor layer, or a conductive film may be already formed over the substrate 100. Then, an insulating film 101 is formed by discharging a composition made from an insulator over the substrate 100.

A composition in which an insulator is dissolved or dispersed in a solvent is used as a composition discharged from a nozzle 109. As the insulator, a resin material such as an epoxy resin, an acrylic resin, a phenol resin, a novolac resin, a melamine resin, or an urethane resin can be used. When these resin materials are used, the viscosity may be adjusted by dissolving or dispersing the resin materials with the use of a solvent. As a material that is liquid repellent, a resin including a fluorine atom, a resin configured by only hydrocarbon or the like can be used. In more detail, a resin including a monomer which contains a fluorine atom within a molecule, or a resin including a monomer which is configured by only a carbon atom and a hydrogen atom can be given as an example. In addition, an organic material such as acrylic, benzocyclobutene, parylene, flare, or polyimide having permeability, a compound material made from polymerization of a polymer including siloxane and the like, a composition containing a soluble homopolymer and a soluble copolymer, or the like can be also used. An organic material is suitable since it has high planarity. Therefore, when a conductive material is formed later, it does not cause a film thickness in a step portion to be thinned extremely, or disconnection. However, when an organic material is used, thin films may be formed from an inorganic material containing silicon below and over the insulating film made from an organic material to prevent degasification. Specifically, a silicon nitride oxide film or a silicon nitride film may be formed by plasma CVD or sputtering.

The polymer including siloxane is given as a typical example of a material in which a skeletal structure is configured by the bond of silicon and oxygen, and at least hydrogen is contained as a substituent, or a material having at least one kind of fluorine, an alkyl group, or aromatic hydrocarbon as a substituent. Hence, various materials within the range of the above-mentioned condition can be used. The polymer including siloxane has preferable planarity, and even has transparency and thermostability. Therefore, heat treatment can be performed at temperatures of about from 300° C. to 600° C. or less after forming an insulator made from a polymer including siloxane. By the heat treatment, treatment of hydrogenation and baking can be performed at the same time, for example. In addition, the viscosity of the polymer including siloxane can be controlled by adjusting the kind or the concentration of a solvent. Hence, the polymer including siloxane can be applied to various usage by appropriately using according to the purpose of the usage.

As the solvent, esters such as butyl acetate and ethyl acetate, alcohols such as isopropyl alcohol and ethyl alcohol, an organic solvent such as methyl ethyl ketone and acetone, and the like can be used. The viscosity of the composition is preferably 50 cp or less in order to prevent drying or to smoothly discharge the composition from an outlet. The surface tension of the composition is preferably 40 mN/m or less. In accordance with a solvent to be used or an application, the viscosity of the composition and the like may be adjusted as required. For example, the viscosity of a composition in which ITO, organic indium or organotin is dissolved or dispersed in a solvent is from 5 mPa·S to 50 mPa·S. The viscosity of a composition in which silver is dissolved or dispersed in a solvent is from 5 mPa·S to 20 mPa·S. The viscosity of a composition in which gold is dissolved or dispersed in a solvent is from 10 mPa·S to 20 mPa·S.

As described above, the first insulating film 101 is formed by selectively discharging a composition over the substrate 100 by a droplet discharging method (FIG. 1A). The usage efficiency of a material can be enhanced since an insulating film can be selectively formed in a necessary portion over a substrate (for example, the entire surface except for an end portion of a substrate) by using a droplet discharging method.

Figure 1B:
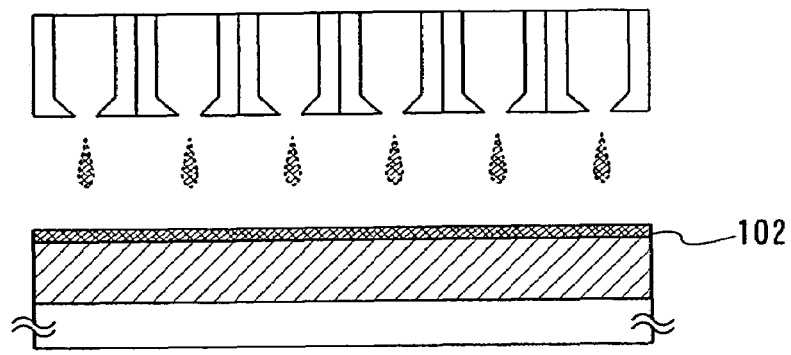

Then, a resist made from an insulator (a second insulating film) 102 is formed over the first insulating film 101 by discharging a composition (FIG. 1B). Here, a photo resist which react with ultraviolet rays is discharged and formed as the second insulating film. A composition containing a photosensitive agent may be used as the resist, and for example, a composition in which a novolac resin, diphenyl silane diol, an acid-generating agent and the like which are typical positive type resists are dissolved or dispersed in a solvent is used. A known solvent is used as the solvent. In addition, the resist 102 may be formed by spin coating. However, the resist can be formed only in a necessary region since the resist may not be formed in an unnecessary edge portion of the substrate by using a droplet discharging method.

Figure 1C:
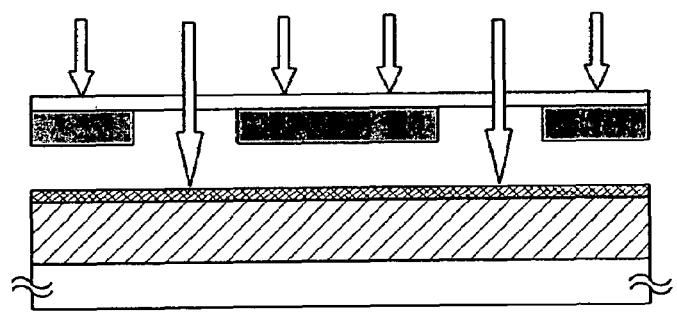
Figure 1D:
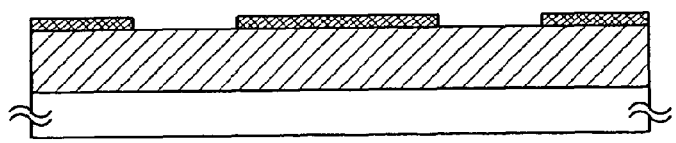

Then, the resist 102 is formed to have a desired shape (FIG. 1D) by performing a step of light-exposure and development (FIG. 1C). Although the step of light-exposure and development is performed with the use of a positive type resist, the step may be performed with the use of a negative type resist.

Figure 1E:
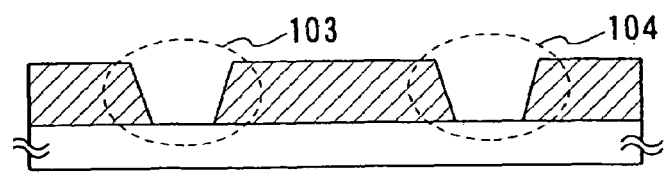

Then, the first insulating film 101 which is not covered with a mask is etched to form openings 103 and 104 by using the processed resist 102 as the mask (FIG 1E).

Either wet etching in which corrosion is performed with a chemical such as sulfuric acid, nitric acid, phosphoric acid, hydrofluoric acid, or dry etching in which RIE (reactive ion etching) is typically used, may be used for the etching treatment, and it can be appropriately selected in accordance with the purpose or the usage. The etching gas may be appropriately selected in accordance with an object to be processed, and a fluorine-based gas such as $CF_4$, $NF_3$ or $SF_6$, or a chlorine-based gas such as $Cl_2$ or $BCl_3$ may be used for etching.

Specifically, when the first insulating film is formed from a polymer including siloxane, an inert gas may be added to an etching gas to be used. As an inert element to be added, one or plural kinds selected from He, Ne, Ar, Kr and Xe can be used. In this embodiment mode, etching is performed by using $CF_4$, $O_2$, He and Ar. In addition, over-etching may be performed by increasing the etching time at the rate of about from 10% to 20% in order to perform etching without leaving any residue over the substrate 100. A tapered shape may be formed by performing etching once or plural times.

The second insulating film 102 served as a mask is removed with the use of a peeling solution. Plasma asher in which the insulating film is removed by being reacted with a plasma gas and vaporized; ozone asher in which $O_3$ (ozone) is decomposed into and converted to an oxygen radical which is a reactive gas to vaporize the insulating film by reacting the oxygen radical with the resist; a wet station over which the most suitable chemical tank to dissolve the insulating film is mounted; or the like can be used. When the plasma asher or the ozone asher is used, impurities such as heavy metal contained in an actual insulating film is not removed. Therefore, it is preferable to clean with the wet station. In this way, a residue of a resist can be completely removed by sequentially performing wet treatment after a dry ashing step.

As described above, an insulating film can be formed without an enlarged apparatus by forming the insulating film by discharging a composition. Therefore, the consumption of a material can be minimum. In addition, the usage efficiency of a material can be enhanced by forming a resist which is to be a mask by a droplet discharging method instead of spin coating.

Embodiment Mode 2

FIGS. 2A to 2D are used to describe Embodiment Mode 2 of the present invention. In Embodiment Mode 2, a method for manufacturing an insulating film when an insulator to be used as a mask is selectively discharged to form the mask, is described.

Figure 2A:
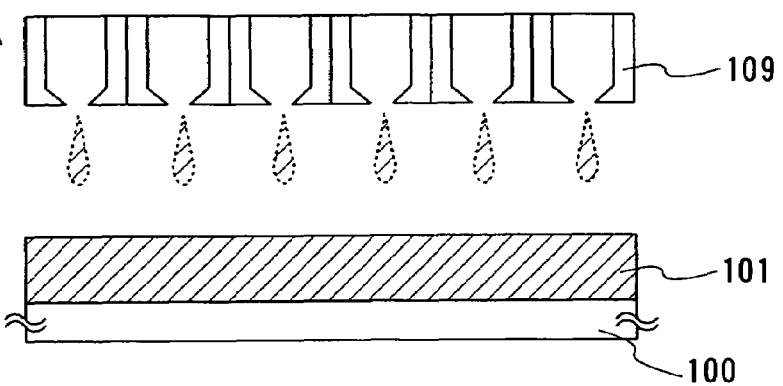
FIGS. 2A to 2D are diagrams to explain a method for manufacturing an insulating film (Embodiment Mode 1).

Initially, a composition is discharged over a substrate 100 to form a first insulating film 101 as Embodiment Mode 1 (FIG. 2A).

Figure 2B:
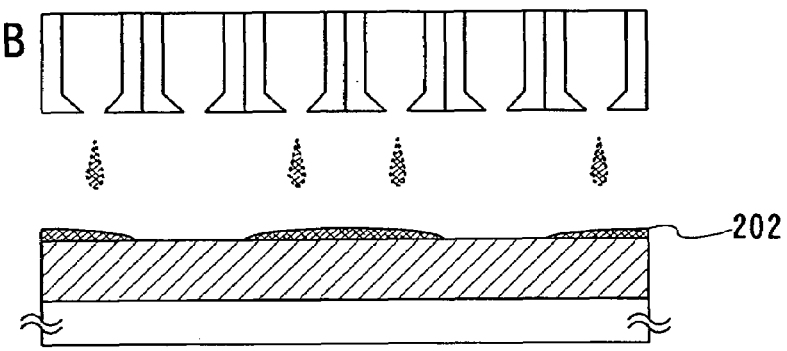

Then, a composition which is different from the first insulating film is selectively discharged over the first insulating film 101 to form a mask (a second insulating film) 202 made from an insulator such as a resist or polyimide is formed (FIG. 2B). A mask in which a selective ratio of etching can be obtained with respect to the first insulating film 101 can be used as the mask 202.

Then, by using the second insulating film 202 as a mask, etching treatment is performed on a part of the first insulating film 101 which is not covered with the mask to form openings 203 and 204. This etching treatment can be performed as Embodiment Mode 1. In addition, a droplet discharging method may be used for forming the openings. In this case, the openings are formed by discharging a wet etching solution from a nozzle 109. However, a cleaning step with a solvent such as water may be appropriately provided to control an aspect ratio of an opening. Naturally, by applying a droplet discharging method also to the cleaning step, shortening the treatment time can be attempted by changing a droplet discharged from the nozzle to water, or by changing a head in which a solution is filled, which makes sequential treatment possible with the use of the identical apparatus.

Figure 2C:
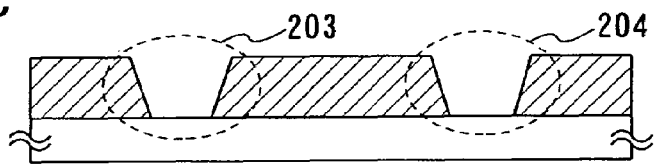

Then, the second insulating film 202 served as the mask is removed with the use of a peeling solution. Through the above-mentioned steps, openings 203 and 204 are formed in the insulating film 101 (FIG. 2C).

Figure 2D:
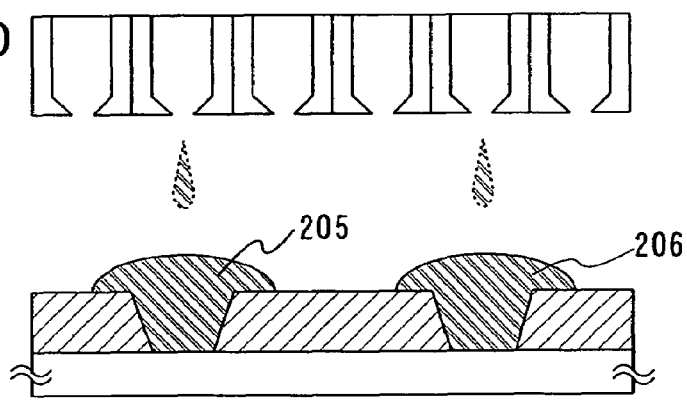

Next, a composition including a conductive material is discharged over the openings 203 and 204 to form conductive films 205 and 206 (FIG. 2D).

As the composition to form the conductive film, a composition in which a conductive material is dissolved or dispersed in a solvent is used. The conductive material corresponds to a fine particle or a dispersant nano-particle of metal such as Ag, Au, Cu, Ni, Pt, Pd, Ir, Rh, W and Al, metal sulfide of Cd and Zn, oxide of Fe, Ti, Si, Ge, Zr and Ba, or silver halide. Alternatively, the conductive material corresponds to Indium Tin Oxide (ITO) used as a transparent conductive film, ITSO including ITO and silicon oxide, organic indium, organotin, Zinc Oxide (ZnO), Titanium Nitride (TiN) and the like. However, it is preferable to use a composition in which any material of gold, silver and copper is dissolved or dispersed in a solvent as the composition discharged from the nozzle considering a specific resistance value. More preferably, silver or copper which is low resistance may be provided. However, when silver or copper is used, a barrier film may be also provided as a measure for impurities.

Although the composition made from the discharged conductive material depends on the diameter of each nozzle equipped in a head and a desired shape of a pattern, the diameter of particles of the conductive material is preferably as small as possible for preventing clogged nozzles and for manufacturing a precise pattern. Preferably, the diameter of the particles is 0.1 μm or less. The composition is made by a known method such as an electrolyzing method, an atomizing method, or a wet reducing method, and a particle size thereof is generally about from 0.5 μm to 10 μm. When the composition is made by a gas evaporation method, each nano-molecule protected with a dispersing agent is minute and is about 7 nm in size. Further, when each surface of nano-particles is covered with a coating, the nano-particles in a solvent are not agglutinated to each other and are uniformly dispersed in the solvent at a room temperature, thereby exhibiting behavior similar to that of aqueous fluid. As a result, the coating is preferably used.

As described above, steps of light-exposing and developing can be omitted by forming the insulating film to be the mask in an arbitrary position by selectively discharging the composition. In addition, steps of light-exposing and developing can be omitted also in forming a wiring by forming a conductive material by selectively discharging a composition. Accordingly, a wiring layer can be formed over a substrate having large size surpassing one meter one a side at low cost and with a preferable yield.

Embodiment Mode 3

Figure 3A:
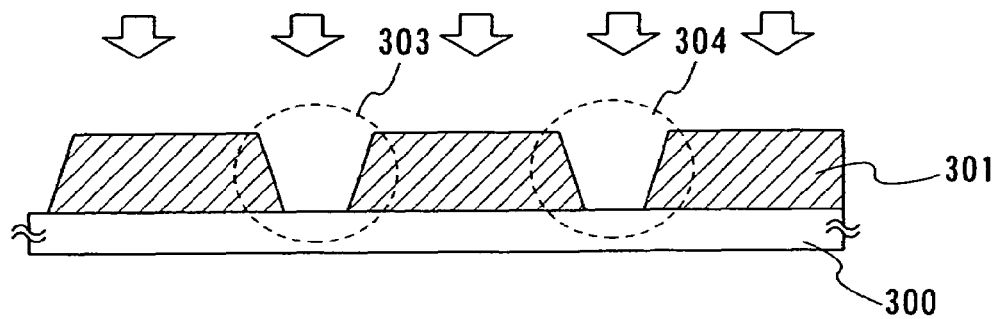
FIGS. 3A and 3B are diagrams to explain a method for manufacturing an insulating film (Embodiment Mode 2).
Figure 3B:
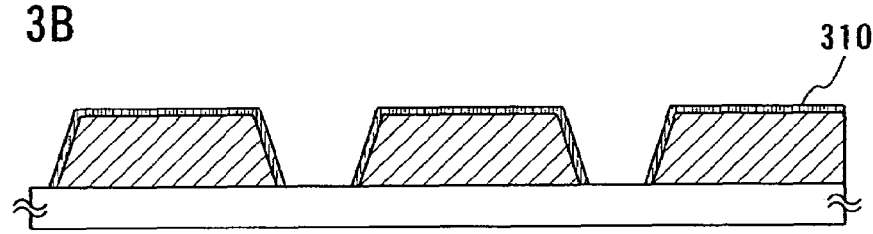

In Embodiment Mode 3, the case of adding an inert element to an insulating film manufactured by a droplet discharging method, which is another feature of the present invention, is described with reference to FIGS. 3A and 3B.

When an inert element with a comparatively large atomic radius is added, distortion is given to an insulating film; therefore, an impurity element such as moisture or oxygen can be prevented from entering by modifying or densifying a surface. In addition, by adding an impurity element, a constituent of a solution is prevented from entering the insulating film or reacting even when a step using liquid (also referred to as a wet step) is performed later. Further, release of moisture or a gas from inside of the insulating film is also prevented. Especially, release of moisture or a gas due to change over time is prevented. Reliability can be enhanced according to the above-mentioned effect.

A method for adding an inert element to an insulating film is described with reference to FIGS. 3A and 3B. To the steps in which an insulating film 301 is formed over a substrate 300 by using a droplet discharging method, and openings 303 and 304 are formed in the insulating film 301 are performed as the methods shown with reference to FIGS. 1A to 1E or FIGS. 2A to 2D. In addition, the openings 303 and 304 are also formed to have a tapered shape in which the diameters become smaller downward by controlling etching conditions (FIG. 3A).

Then, an inert element 305 is added to the insulating film 301 which is formed to have a tapered shape to form a densified portion 310 on the surface of the insulating film. A known method such as an ion doping method, an ion implantation method or a plasma treatment method can be employed as a method for adding the inert element. As the inert element to be added, one or plural kinds selected from helium (He), neon (Ne), argon (Ar), krypton (Kr) and xenon (Xe) is used. Preferably, argon (Ar) which has a comparatively large atomic radius and is inexpensive may be used. Further, a material in which permeability of the insulating film is not lowered even when the inert element is added, may be used. Distortion is given by adding an inert element with a comparatively large atomic radius to modify or densify a surface (including a side surface) for preventing the entry of moisture or oxygen. Doping may be further performed from an oblique direction, or a process in which the inert element is added to a side surface of the opening or a side surface of an edge portion by plasma treatment may be added since the inert element is not sufficiently doped to the side surface of the opening or the side surface of the edge portion when a taper angle is not sufficient.

The insulating film may be formed to include an inert element at the concentration of from $1 \times 10^{19}$ atoms/cm$^3$ to $5 \times 10^{21}$ atoms/cm$^3$, preferably from $2 \times 10^{19}$ atoms/cm$^3$ to $2 \times 10^{21}$ atoms/cm$^3$. Afterwards, a conductive film, a semiconductor or an insulating film is formed over the insulating film, if necessary.

According to this embodiment mode, by adding an impurity element, and by modifying the surface of the insulating film, a constituent of a solution is prevented from entering the insulating film or reacting when a step using liquid (also referred to as a wet step) is performed later. Further, release of moisture or a gas from the insulating film is also prevented when a heat treatment step is performed later. Additionally, release of moisture or a gas from the insulating film due to a change over time is prevented, which results in enhancing reliability of a semiconductor device.

Embodiment Mode 4

In this embodiment mode, the case of forming a barrier layer by using a droplet discharging method is described with reference to FIGS. 4A and 4B and FIGS. 5A and 5B.

Figure 4A:
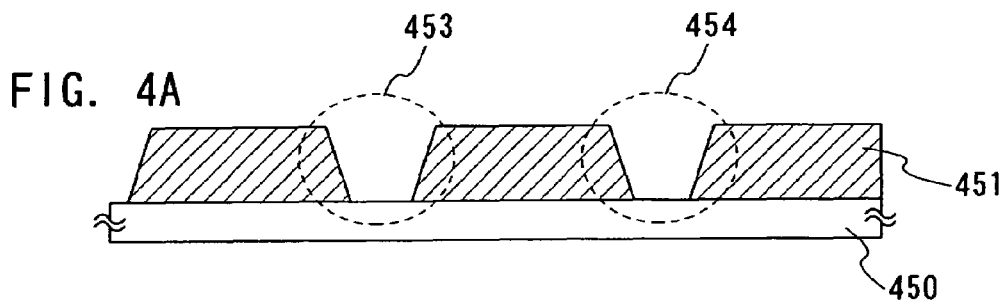
FIGS. 4A and 4B are diagrams to explain a method for manufacturing an insulating film (Embodiment Mode 3).
Figure 4B:
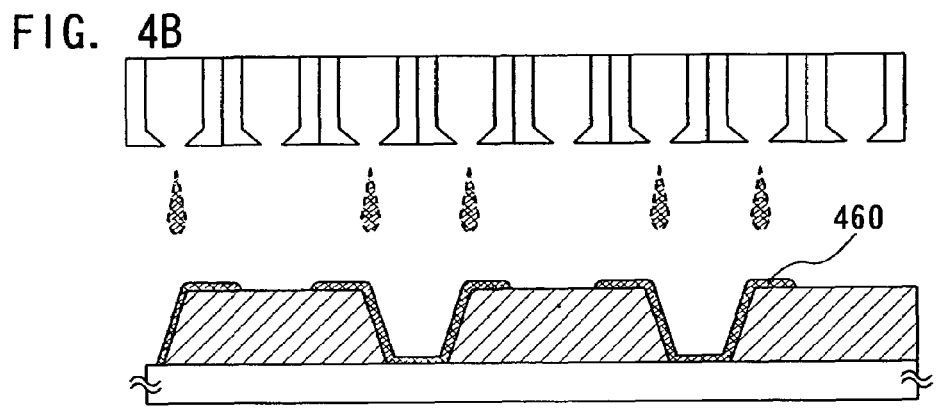
Figure 5A:
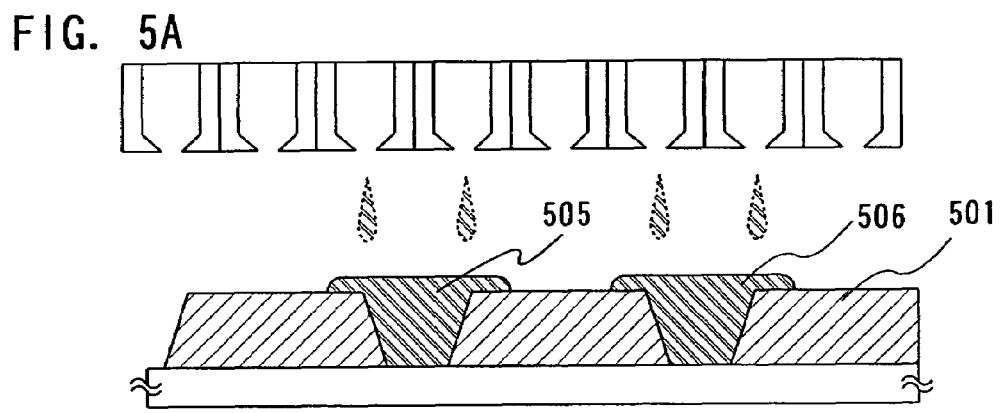
FIGS. 5A and 5B are diagrams to explain a method for manufacturing an insulating film (Embodiment Mode 4).
Figure 5B:
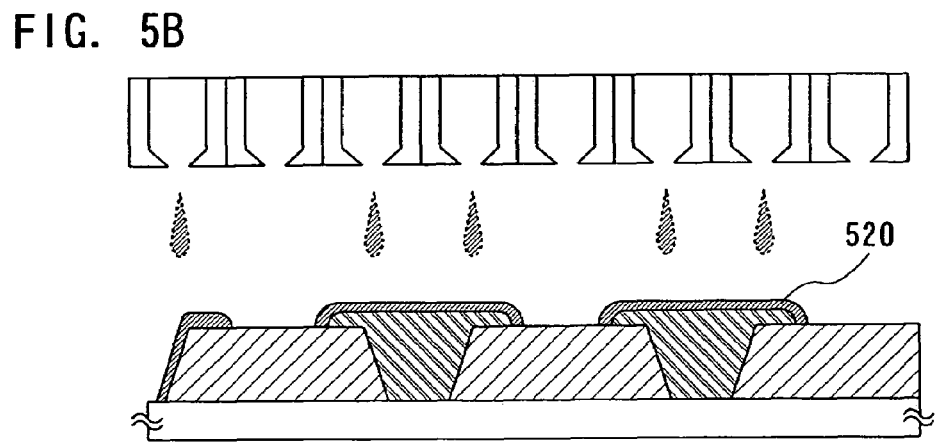

FIGS. 4A and 4B show the case of forming a barrier layer in an opening formed in an insulating film, and FIGS. 5A and 5B show the case of forming a barrier layer over an insulating film and the surface of a conductive film.

Initially, as shown in the above-mentioned embodiment mode, an insulating film 451 is formed over a substrate 450 by discharging a composition, and openings 453 and 454 are provided in the insulating film by etching (FIG. 4A). Here, the openings 453 and 454 may be formed to have tapered shapes as FIGS. 2A to 2D.

Then, a barrier layer 460 is formed by selectively discharging a composition to the openings 453 and 454 and an edge portion of the insulating film (FIG. 4B). Protection and stabilization of the surface of the insulating film 451 in the openings 453 and 454, and an edge portion of the insulating film 451 can be attempted by forming the barrier layer 460. In other words, the barrier layer functions to protect the inside from contamination of a corrosive gas, moisture, a metal ion and the like. In addition, a wiring to be formed later to cover the openings 453 and 454 can be prevented from being disconnected due to a step by forming the barrier layer of a conductive film.

FIGS. 5A and 5B show the case of forming a barrier layer over a conductive film 505 after forming the conductive film 505 in an opening.

Initially, an opening is formed in an insulating film as described in the above-mentioned embodiment mode. Then, a conductive material is filled in the opening by discharging a composition to form conductive films 505 and 506. Then, a barrier layer 520 is formed over the conductive films 505 and 506 and an edge portion of an insulating film 501 by a droplet discharging method.

As a composition included in the barrier layer, a composition which has characteristics to prevent the entry of moisture or oxygen, and has viscosity of 50 cp or less so that the barrier layer 520 can be formed by a droplet discharging method are preferable. As the composition having these characteristics, a known conductive material, or a resin material such as an epoxy resin, an acrylic resin, a phenol resin, a novolac resin, a melamine resin, or an urethane resin are preferable as examples. When these resin materials are used, the viscosity may be adjusted by dissolving or dispersing the resin materials with the use of a solvent. In addition, as the barrier layer a resin that is liquid repellent is preferable, and for example, a resin including a fluorine atom or a resin configured by only hydrocarbon are preferable. In more detail, a resin including a monomer which contains a fluorine atom within a molecule, or a resin including a monomer which is configured by only a carbon atom and a hydrogen atom may be given as examples.

In addition, when the barrier layer is formed from a conductive material, it is necessary to form the barrier layer so as not to cause a short circuit with a wiring. Accordingly, it is preferable that the barrier layer is formed from the resin material in a region where there is a possibility that a short circuit may be generated with a wiring.

When a barrier layer is formed, there is a possibility that disconnection due to a step occurs according to an angle of a side surface in the opening. Therefore, it is necessary that the side surface in the opening is formed to have a gentle inclined surface. Specifically, the side surface may be formed to be a tapered shape of from more than 30° to less than 75°. Moreover, in order to prevent disconnection due to a step, treatment of baking a composition after discharging one or plural drops, and curing the composition may be performed. In other words, discharging and baking may be repeated.

In FIGS. 4A and 4B and FIGS. 5A and 5B, it is more preferable to modify the surface of the insulating film by adding an impurity element before forming the barrier layer as shown in Embodiment Mode 3.

As described above, the insulating film to which an impurity element is added, or the insulating film over which the barrier layer is laminated may be used as an interlayer insulating film, or an interlayer insulating film including an opening. As a result, deterioration of an element caused by entry of a substance such as moisture or oxygen can be prevented. Note that this embodiment mode can be freely combined with the above-mentioned embodiment mode.

Embodiment Mode 5

Figure 6A:
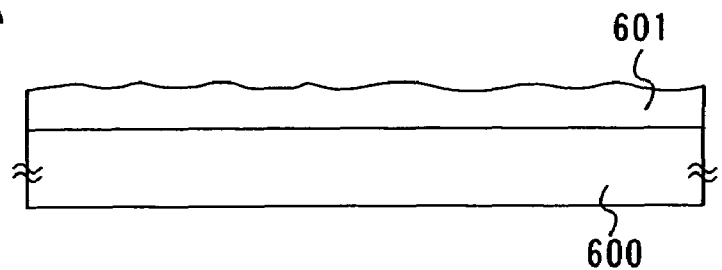
FIGS. 6A to 6C are diagrams to explain a method for planarizing an insulating film (Embodiment Mode 5).
Figure 6B:
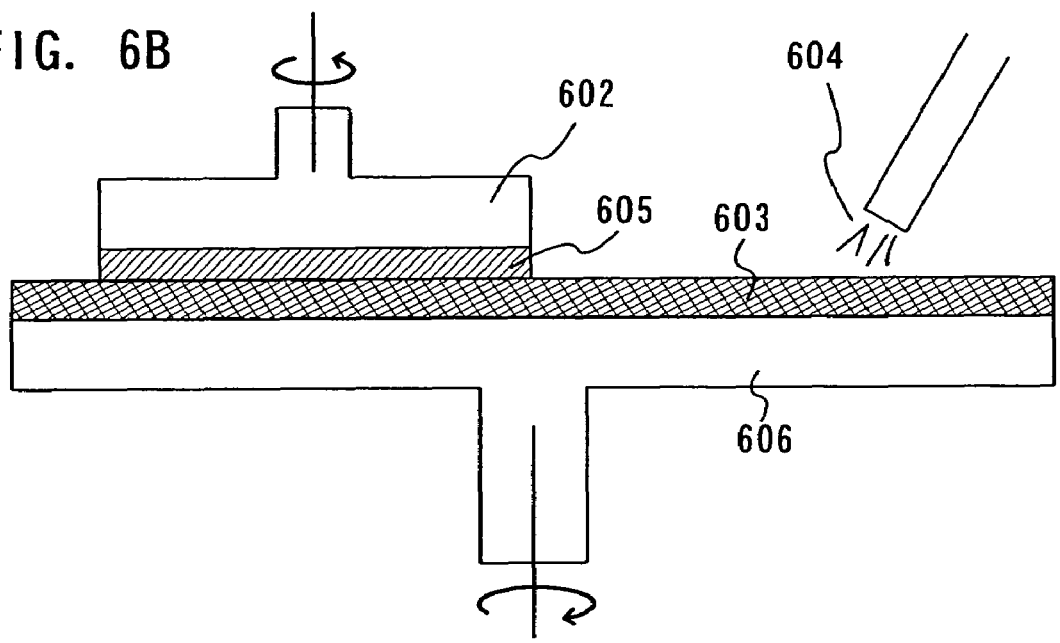
Figure 6C:
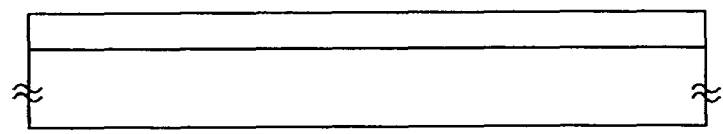

FIGS. 6A to 6C are used to describe Embodiment Mode 5. FIGS. 6A to 6C show the case where planarizing treatment is performed on an insulating film formed by discharging a composition.

Usually, a surface condition of a film when the film is formed over a substrate by sputtering or CVD depends on a surface condition of the substrate before forming the film. Therefore, when there is a step over a substrate before forming the film, a step occurs also over a surface after forming the film.

On the other hand, in a droplet discharging method, the amount of the discharge rate can be controlled in discharging a composition. Hence, a step can be modified even when there is a step before forming a film if the discharge rate is determined in advance depending on a spot. However, it is conceivable that unevenness may be generated on the surface due to the kind of a solvent, the viscosity or the discharging rate once. When unevenness is increased on the surface, in the case of laminating a wiring, an open defect due to disconnection of a wiring layer, or a short circuit defect due to poor insulation between wiring layers are generated according to the poor step coverage in a step portion. In addition, in a photolithography step, a minute pattern formation becomes difficult since a film thickness of a resist fluctuates in a step portion and the focus of a lens is partially not correct in light-exposing. Therefore, when unevenness of a discharged composition can not be ignored, it is preferable to perform planarizing treatment after forming an insulating film with a droplet discharging method. FIGS. 6A to 6C are used to specifically describe the planarizing treatment.

Initially, an insulating film 601 is formed by discharging an insulator over a substrate 600 (FIG. 6A). Then, planarizing treatment is performed on the insulating film 601. As the planarizing treatment, reflow planarization, CMP planarization, bias sputtering planarization, etchback planarization, or the like, or a combination thereof is performed. Note that an example of performing planarization by CMP is shown here.

In CMP, polishing of the surface of a substrate is performed with balance of mechanical polishing with chemical action among a wafer 605 mounted on a head (a carrier) 602 for supporting, an abrasive cloth (a pad) 603 mounted on an abrasive molding board 606, and abrasive liquid (slurry) 604 supplied thereto (FIG. 6B). It makes unevenness on the surface of the insulating film planarized (FIG. 6C).

As described above, planarization on the surface of the insulating film can be actualized by performing planarizing treatment such as CMP after forming the insulating film by discharging a composition.

As shown in this embodiment mode, unevenness on the surface is planarized by performing the planarizing treatment on the insulating film formed by the droplet discharging method. Therefore, it is highly effective when wirings are formed by laminating in multi-layer. In addition, the improvement of a yield can be realized by preventing disconnection due to a step or a short circuit of an electrode and the like by performing planarization.

Note that this embodiment mode can be freely combined with the above-mentioned embodiment mode.

Embodiment 1

Figures are used to describe a method for manufacturing a semiconductor device in which the present invention is applied to manufacturing an insulating film is described.

In embodiment 1, a method for manufacturing a thin film transistor using an amorphous semiconductor (amorphous silicon, a-Si) is explained. Initially, FIGS. 7A to 7D and FIGS. 8A to 8C are used to describe a method for manufacturing a top gate type (a stagger type) thin film transistor using an amorphous semiconductor (amorphous silicon, a-Si).

Figure 7A:
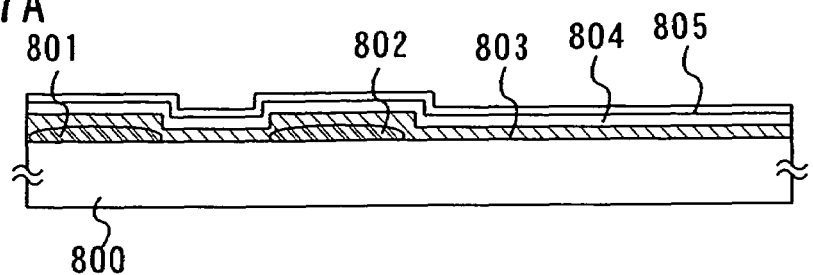
FIGS. 7A to 7D are diagrams to explain a method for manufacturing a semiconductor device (Embodiment 1).

Initially, conductive films 801 and 802 are formed over a substrate 800 by discharging a composition. Then, an n-type amorphous semiconductor 803, an amorphous semiconductor 804 are formed to cover the conductive films 801 and 802, and an insulating film 805 is laminated thereover. Although the insulating film 805 may be formed by plasma CVD or sputtering, it is manufactured by a droplet discharging method here. In addition, the discharge rate is controlled at this time so that a depression is formed over the insulating film 805 (FIG. 7A).

Then, a gate electrode 806 is formed over the insulating film 805 by discharging a composition. At this time, the depression is formed over the insulating film 805; therefore, the composition can be applied more precisely by utilizing the depression as a bank. Thus, a conductive material can be precisely formed in an arbitrary point.

Figure 7B:
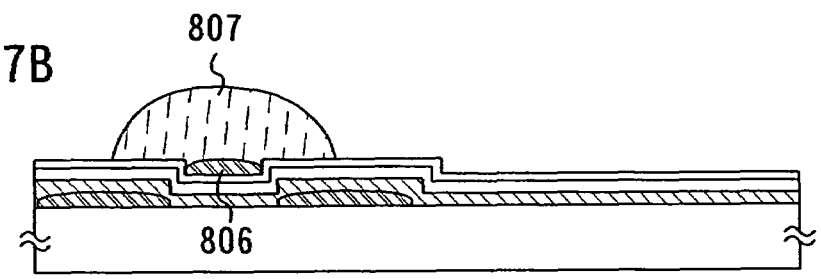

Then, a mask 807 formed from an insulator such as a resist or polyimide is formed by discharging a composition (FIG. 7B). Then, an n-type amorphous semiconductor 808, an amorphous semiconductor 809 and an insulating film 810 are formed by patterning the n-type amorphous semiconductor 803, the amorphous semiconductor 804 and the insulating film 805 simultaneously.

Figure 7C:
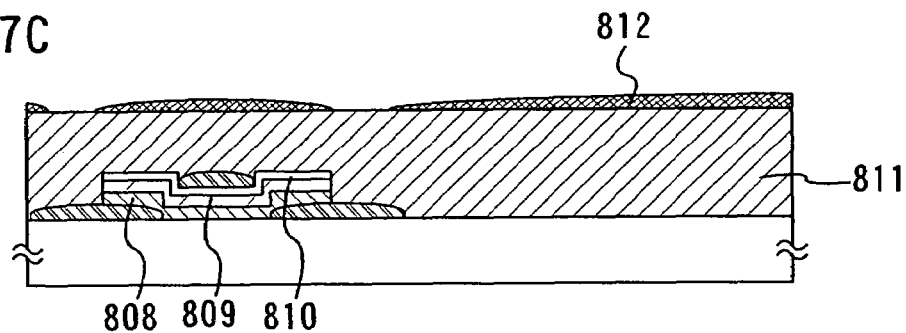

Then, an insulating film 811 is formed by discharging a composition, and a mask 812 formed from an insulator such as polyimide is further formed thereover by discharging a composition which is different from the composition used for the insulating film 811 (FIG. 7C). Here, a composition which includes a siloxane system material, contains $1\times10^{20}/cm^3$ of the Si—CH$_3$ bond or Si—C bond, or contains $1\times10^{20}/cm^3$ or more of C, and has no crack of 3 μm or more in 100 μm square, is used as the insulating film 811.

Figure 7D:
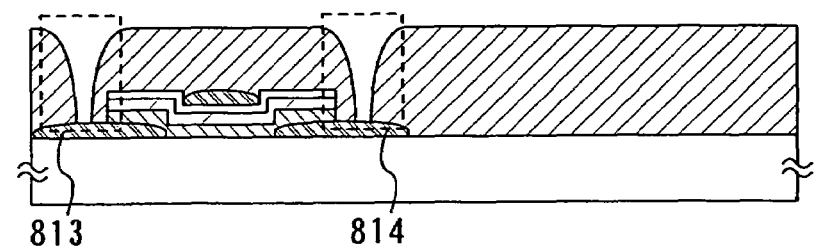

A portion which is not covered with the mask is etched to form openings 813 and 814, and the mask 812 is removed (FIG. 7D). Here, either wet etching in which corrosion is performed with etchant such as sulfuric acid, nitric acid, phosphoric acid or hydrofluoric acid, or dry etching in which RIE (reactive ion etching) is typically used can be used as the etching treatment. It can be appropriately selected in accordance with the purpose or utilization. An etching gas can be appropriately selected in accordance with an object to be processed, and a fluorine-based etching gas such as $CF_4$, $NF_3$ or $SF_6$, or a chlorine-based etching gas such as $Cl_2$ or $BCl_3$ can be used.

Figure 8A:
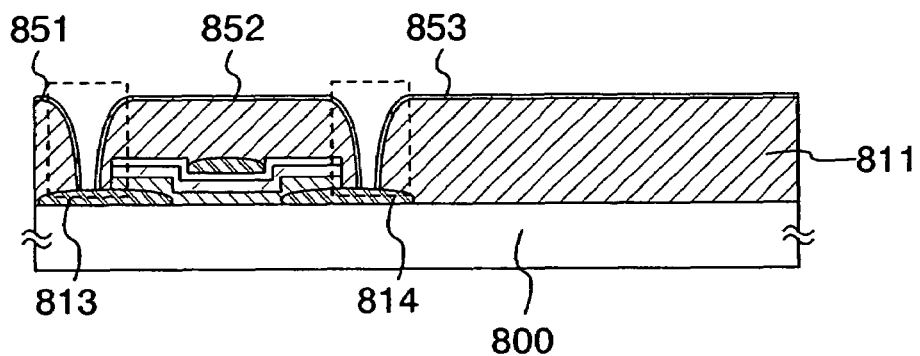
FIGS. 8A to 8C are diagrams to explain a method for manufacturing a semiconductor device (Embodiment 1).

Then, surface modification is performed by adding an impurity element to the insulating film 811 (reference numerals 851 to 853 in FIG. 8A). As a method for adding an impurity element, a method such as ion doping, ion implantation, plasma treatment are given as examples, and one or plural kinds selected from helium (He), neon (Ne), argon (Ar), krypton (Kr) and xenon (Xe) may be used as an impurity element to be added.

Figure 8B:
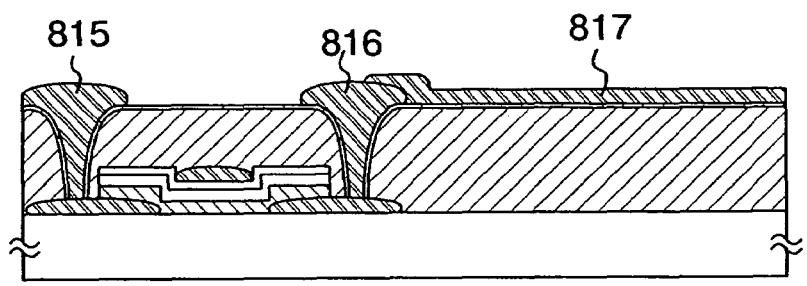

Then, conductive films 815 and 816 are formed by discharging a composition including a conductive material so as to fill the openings 813 and 814. A conductive film 817 is formed by discharging a composition including a conductive material so as to contact with the conductive film 816 (FIG. 8B). Here, the conductive film 817 functions as a pixel electrode.

Figure 8C:
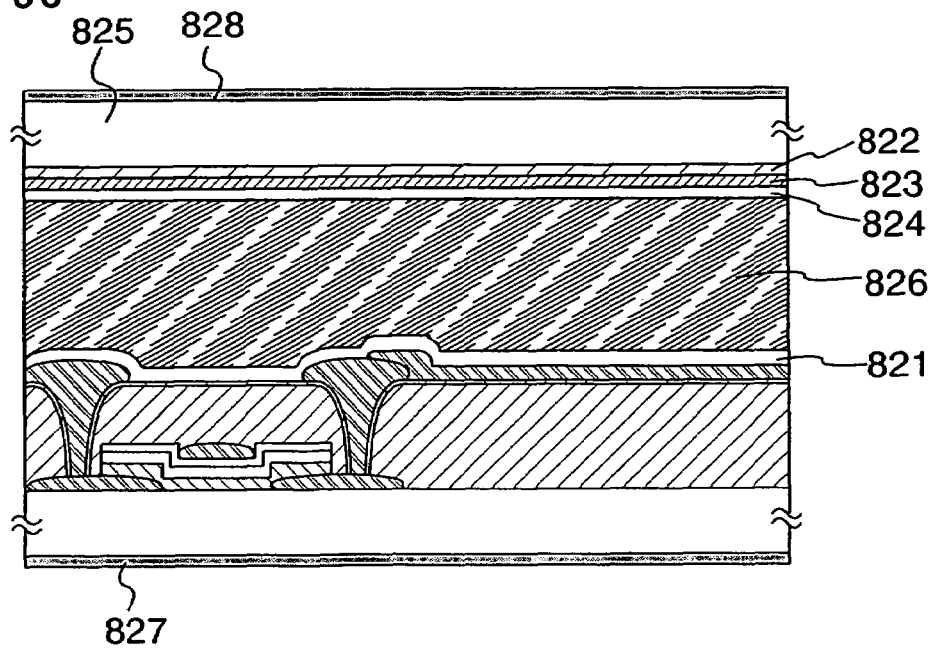

Then, an orientation film 821 is formed. A substrate 825 over which a color filter 822, an opposite electrode 823 and an orientation film 824 are formed is attached to the substrate 800 by heating a sealant to cure. Afterwards, a semiconductor device using liquid crystal and having a display function is completed by injecting liquid crystal 826. Polarization plates 827 and 828 are attached to the substrates 800 and 825 (FIG. 8C).

Subsequently, FIGS. 9A to 9E are used to describe a method for manufacturing a semiconductor device in which a channel protective type thin film transistor using an amorphous semiconductor is formed, and the invention is applied to manufacturing a wiring connected to the thin film transistor.

Initially, a gate electrode 901 is formed over a substrate 900 by discharging a composition. The gate electrode 901 can be formed over the substrate 900 by selectively discharging a composition which includes a conductive material. Here, as the substrate 900, a substrate formed from an insulator such as glass, quartz, plastic or alumina, a substrate in which an insulating film such as silicon oxide or silicon nitride is formed on the surface of a metal substrate such as stainless-steel, a semiconductor substrate or the like can be applied. In addition, it is desirable to form an insulating film such as silicon oxide, silicon nitride or silicon oxynitride on the surface of the substrate such as plastic or alumina to prevent an impurities or the like from being dispersed from a substrate side.

Then, an insulating film 902 is formed over the gate electrode 901. Although the insulating film 902 may be formed by a thin film formation method such as plasma CVD or sputtering, in this embodiment, it is formed by a droplet discharging method. Being formed by a droplet discharging method, an insulating film having preferable planarity can be formed without generating a number of steps compared with the case when it is formed by CVD or sputtering.

Figure 9A:
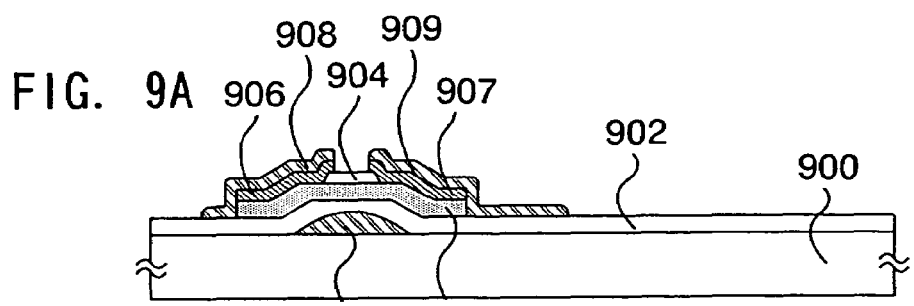
FIGS. 9A to 9E are diagrams to explain a method for manufacturing a semiconductor device (Embodiment 1).

Then, an amorphous semiconductor is formed over the insulating film 902 and an insulating film is formed over the entire surface so as to cover the amorphous semiconductor. Then, an insulating film 904 which is to be an etching stopper is formed by patterning only the insulating film with the use of a mask. Then, an n-type amorphous semiconductor is formed over the entire surface to cover the insulating film 904. Afterwards, an amorphous semiconductor film 905 and n-type amorphous semiconductor films 906 and 907 are formed by patterning the amorphous semiconductor and the n-type amorphous semiconductor simultaneously with the use of a mask. Then, conductive films 908 and 909 connected to the n-type amorphous semiconductors 906 and 907 are formed (FIG. 9A).

Figure 9B:
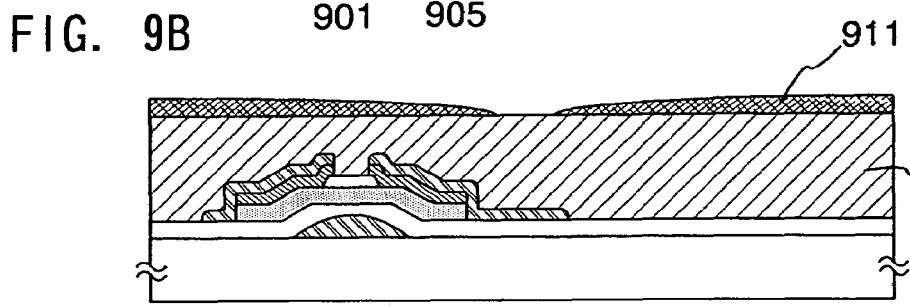
Figure 9C:
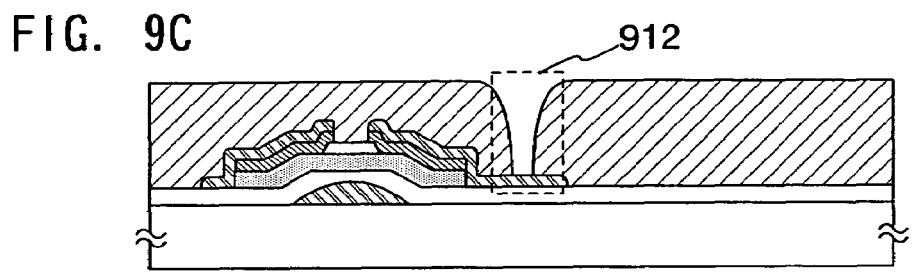

Subsequently, an insulating film 910 is formed by discharging a composition to form a mask 911 formed from an insulator such as polyimide in an arbitrary spot over the insulating film 910 (FIG. 9B). Although an insulating film is used as the mask 911 here, the mask may be formed from a conductive material as long as it can obtain a selective ratio of etching with respect to the insulating film 910. Afterwards, an opening 912 is formed so that a part of the conductive film 909 is exposed by etching a part which is not covered with the mask.

Figure 9D:
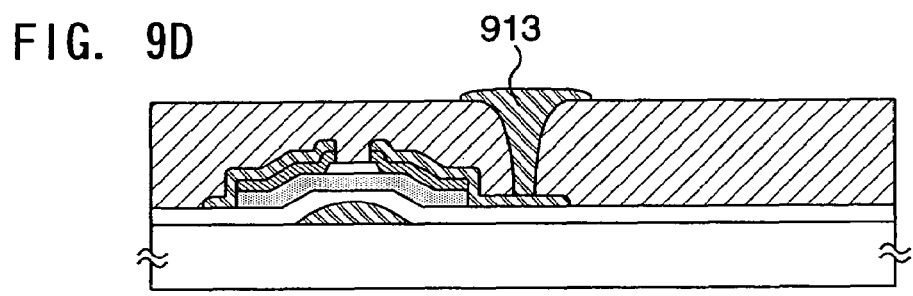
Figure 9E:
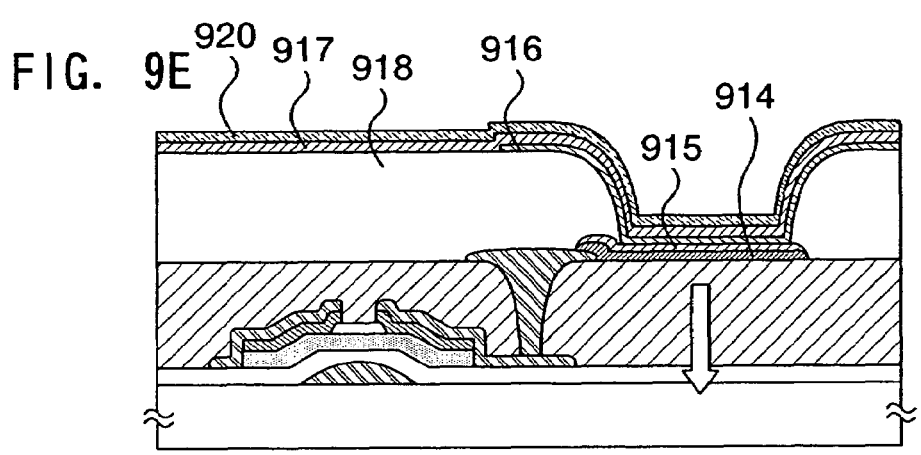

Then, a conductive film 913 is formed by discharging a composition which includes a conductive material so as to fill the opening 912 (FIG. 9D). Then, conductive films 914 and 915 are formed by discharging a composition which includes a conductive material so as to contact with the conductive film 913. The conductive films 914 and 915 are formed from a conductive material having light-transmitting properties. Specifically, the conductive films are formed from indium tin oxide (ITO) and ITSO including ITO and silicon oxide. Then, an electroluminescent layer 916 and a conductive film 917 are formed so as to be in contact with the conductive film 915. The conductive film 917 functions as a cathode and the conductive film 915 functions as an anode. Subsequently, a shield 920 is formed so as to cover the entire surface. Through above-mentioned steps, a so-called bottom emission semiconductor device in which light is emitted from a light emitting element to the side of the substrate 900 is completed (FIG. 9E). In addition, the structure corresponds to the case when a transistor having an amorphous semiconductor as a channel portion is an n-type transistor.

Either an organic material such as acrylic or polyimide, or inorganic material such as silicon oxide, silicon oxynitride, or siloxane system can be used as an insulating layer 918 which functions as a bank, and either a photosensitive material or a non-photosensitive material can be used. Preferably, the insulating layer 918 may be formed in a shape in which the radius of curvature varies continuously so that the electroluminescent layer 916 to be formed later is not disconnected due to a step. There are three types for emitting light from a light emitting element: top emission in which light is emitted to the substrate side, bottom emission in which light is emitted to the opposite side thereof, and dual emission in which light is emitted to both the substrate side and the opposite side thereof by forming a pair of electrodes from a transparent material or by forming electrodes in a thickness capable of transmitting light. Any of these can be applied. In addition, any of a monolayer type, a lamination layer type or a mixed type which has no interface of a layer can be used as the electroluminescent layer 916. Furthermore, any of a singlet material, a triplet material or material in which these materials are combined can be used as the electroluminescent layer 916. Moreover, any of an organic material including a low molecular weight material, a high molecular weight material and a medium molecular weight material, an inorganic material typified by molybdenum oxide and the like with preferable electron injection characteristics, or a complex material of the organic material and the inorganic material may be used. Although the electroluminescent layer 916 is formed by a known method such as vapor deposition, it may be formed by a droplet discharging method in view of takt time or the manufacture cost. Thus, in the invention which utilizes a droplet discharging method for manufacturing an insulating layer or a thin film, further reduction in takt time and the manufacture cost can be achieved.

Hereupon, a semiconductor device includes an image display device, a light emitting device, and a light source such as a lighting system. Further, the semiconductor device includes a panel which enclose a pixel portion and a driver circuit between a substrate and a cover material, a module in which an FPC is attached to the panel, a module in which a driver IC is provided at the point of the FPC, a module in which a driver IC is mounted on the panel by COG technology or the like, a display using for a monitor, and the like.

Moreover, in the above-mentioned transistor, a transistor in which an amorphous semiconductor serves as a channel portion is shown. However, the invention is not limited thereto and a semi-amorphous semiconductor (hereinafter, referred to as an SAS) in which a crystal grain is dispersed in an amorphous semiconductor may be used. A transistor using an SAS has the mobility of from 2 cm$^2$/V·sec to 10 cm$^2$V·sec, which is from twice to 20 times electric field-effect mobility of that of a transistor using an amorphous semiconductor. A transistor using an SAS also has an intermediate structure of an amorphous structure and a crystal structure (including single crystal and polycrystal). The semiconductor is a semiconductor having a tertiary state which is stable in view of free energy, and a crystalline material having a short distance order and lattice distortion. The semiconductor can be dispersed in a non-monocrystal semiconductor by making its grain diameter from 0.5 nm to 20 nm. In addition, the semiconductor includes hydrogen or halogen at least 1 atomic % or more in order to terminate an uncombined band (a dangling bond). Further, a preferable SAS can be obtained by further promoting lattice distortion by adding a rare gas element such as helium, argon, krypton or neon to enhance stability. Description regarding such an SAS is disclosed in, for example, patent bulletin 3065528. This embodiment can be freely combined with the above-mentioned embodiment mode.

Embodiment 2

A semiconductor to which a method for manufacturing an insulating layer of the present invention is applied is described by using figures.

Figure 11A:
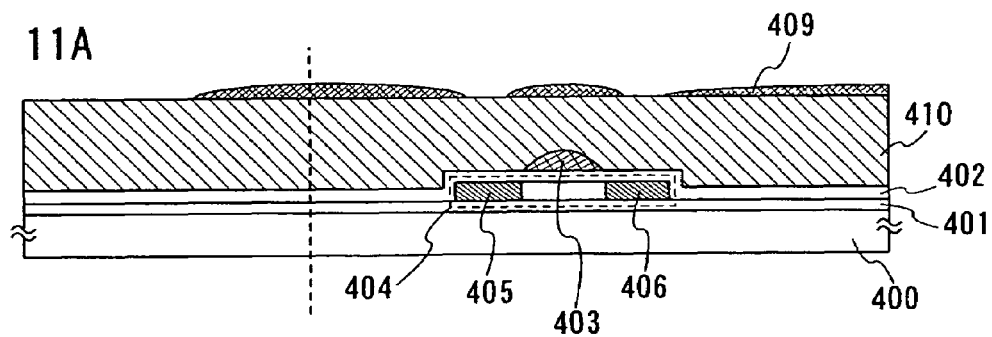
FIGS. 11A to 11D are diagrams to explain a method for manufacturing a semiconductor device (Embodiment 2).

Initially, a base insulating film 401 including an insulating film such as a silicon oxide film, a silicon nitride film or a silicon oxynitride film is formed over a substrate 400 as shown in FIG. 11A. As a material of the substrate 400, a glass substrate, a quartz substrate, a semiconductor substrate, a metal substrate or a plastic substrate is used. The base insulating film 401 may have a monolayer structure of the insulating film or a structure in which two or more of the insulating films are laminated. Then, an amorphous semiconductor film is formed over the base insulating film. The amorphous semiconductor film is formed by using a known method (sputtering, LPCVD, plasma CVD or the like). Then, the amorphous semiconductor film is crystallized by a known crystallization method such as a laser crystallization method, a heat crystallization method using RTA or an annealing furnace, a heat crystallization method using a metal element which promotes crystallization or the like. A semiconductor film 404 is formed by patterning a crystalline semiconductor film obtained in this way to have a desired shape.

A gate insulating film 402 which covers the semiconductor film 404 is formed. An insulating film such as a silicon oxide film is formed by plasma CVD or sputtering as the gate insulating film 402. The gate insulating film 402 may be also formed by a droplet discharging method. When it is manufactured by a droplet discharging method, a step can be modified by controlling the discharge rate.

A gate electrode 403 is formed over the gate insulating film 402 by selectively discharging a composition including a conductive material. In this case, the diameter of a nozzle used for the droplet discharging method is set at from 0.1 μm to 50 μm (preferably from 0.6 μm to 26 μm), and the discharge rate of a composition discharged from the nozzle is set at from 0.00001 pl to 50 pl (preferably from 0.0001 pl to 10 pl). The discharge rate increases in proportion to the size of the nozzle diameter. The distance between an object to be processed and a nozzle outlet is made to be close as much as possible to drop a composition on a desired spot, and is preferably set at about from 0.1 nm to 2 nm.

Then, a source region 405 and a drain region 406 are formed by doping impurities to the semiconductor 404 by using the gate electrode 403 as a mask.

Then, an insulating film 410 is formed by using a droplet discharging method. The insulating film 410 is formed from a material including silicon such as a silicon oxynitride film, an organic material such as acrylic or polyimide having light transmitting properties, a compound material formed by polymerization of polymer including siloxane or the like. The insulating film 410 is formed of a monolayer or two or more layers using the material. The polymer including siloxane is given as a typical example of a material in which a skeletal structure is configured by the bond of silicon and oxygen and at least hydrogen is contained as a substituent, or a material having at least one kind of fluorine, an alkyl group and aromatic hydrocarbon as a substituent. Therefore, various materials in the range of the above-mentioned conditions can be used. An organic material and a material in which a skeletal structure is configured by the bond of silicon and oxygen has preferable planarity. Therefore, these materials are preferable since a film thickness is not thinned extremely in a step portion or disconnection is not generated even when a conductive material is formed later. In addition, a material in which a skeletal structure is configured by the bond of silicon and oxygen also has transparency and thermostability; therefore, heat treatment of about 300° C. can be performed after film formation. Treatment of hydrogenation and baking can be performed simultaneously by the heat treatment.

Then, a resist 409 which is selectively to be a mask is formed over the insulating film 410 (FIG. 11A). As the resist 409, a resist which can obtain a selective ratio with respect to the insulating film 410 may be used.

Then, openings 411 and 412 which forms a contact with a lower layer side are formed by etching a portion not covered with the mask.

In this embodiment, although the case when the insulating film 410 and the gate insulating film 402 are etched by two step etching is shown as an example, this embodiment is not limited thereto. Here, the case when polymer including siloxane is used for the insulating film 410, and a film containing a large amount of oxygen is used for the gate insulating film 402 is shown.

In this embodiment, etching (wet etching or dry etching) is performed on the gate insulating film 410 under the condition where a selective ratio can be obtained with respect to the gate insulating film 402. An inert gas is added to an etching gas to be used in etching the gate insulating film 410. As an inert element to be added, one or plural kinds selected from He, Ne, Ar, Kr and Xe can be used. In the invention, one or plural kinds selected from Ar, Kr and Xe which have a comparatively large atomic radius among inert elements are added to the etching gas with 26% or more and 50% or less of the total flow. Above all, it is preferable to use argon since it has a comparatively large atomic radius and is inexpensive. In this embodiment, $CF_4$, $O_2$, He and Ar are used. When dry etching is performed, the etching is performed under the conditions: a flow of $CF_4$ is set at 380 sccm; $O_2$, 290 sccm; He, 500 sccm; Ar, 500 sccm; an RF power, 3000W; and a pressure, 25 Pa. As a chamber of etching apparatus of this embodiment, apparatus with volume of about 0.335 $m^3$ is used. An etching residue can be decreased according to the above conditions.

In order to perform etching without leaving any residue over the insulating film 410, etching time may be increased at the rate of about from 10% to 20%. A tapered shape may be formed by performing etching once or plural times. Here, in order to form the tapered shape, a second dry etching is further performed by setting a flow of $CF_4$ at 550 sccm; a flow of $O_2$, 450 sccm; a flow of He, 450 sccm; an RF power, 3000W; and a pressure, 25 Pa with the use of $CF_4$, $O_2$, and He.

An opening which reaches the source region and the drain region is formed by etching the gate insulating film 402. A mask to be used for etching may be formed again, or the resist mask formed before may be used. The etched insulating film 410 may be also used as the mask. In this embodiment, the openings 411 and 412 which reach an impurity region are formed by etching the gate insulating film 402 by using the resist 409 and the insulating film 410 as a mask. $CHF_3$, Ar, He or the like may be used for the etching gas. In this embodiment, an inert gas is added to the etching gas to be used. As the inert element to be added, one or a plural kinds of inert gases selected from He, Ne, Ar, Kr and Xe can be used. In this embodiment, as the etching gas, one or plural kinds selected from Ar, Kr and Xe which have a comparatively large atomic radius are added so as to be 60% or more and 85% or less, more preferably, with 65% or more and 85% or less of the total flow. Above all, it is preferable to use argon since it has a comparatively large atomic radius and is inexpensive. In this embodiment, etching treatment of the insulating film 412 is performed with an etching gas in which $CHF_3$ and Ar are used. It is preferable to perform over-etching by increasing the etching time at the rate of about from 10% to 20% in order to perform etching without leaving a residue over a semiconductor layer.

Then, the resist 409 is removed. The resist 409 can be effectively removed by oxidation since the resist 409 is an organic matter (in other words, an organic matter is converted to $CO_2$ and $H_2O$). Plasma asher in which the insulating film is removed by being reacted with a plasma gas and vaporized; ozone asher in which $O_3$ (ozone) is decomposed into and converted to an oxygen radical which is a reactive gas to vaporize the insulating film by reacting the oxygen radical with the resist; or the like can be used. As asher, asher which has the high oxidation rate and little damage is preferable. In addition, a wet method may be used for removing the resist. A wet station or the like on which the most suitable chemical tank is mounted to dissolve the insulating film is used. When the plasma asher or the ozone asher is used, impurities such as heavy metal contained in an actual insulating film is not removed. Therefore, it is preferable to clean with the wet station.

Figure 11B:
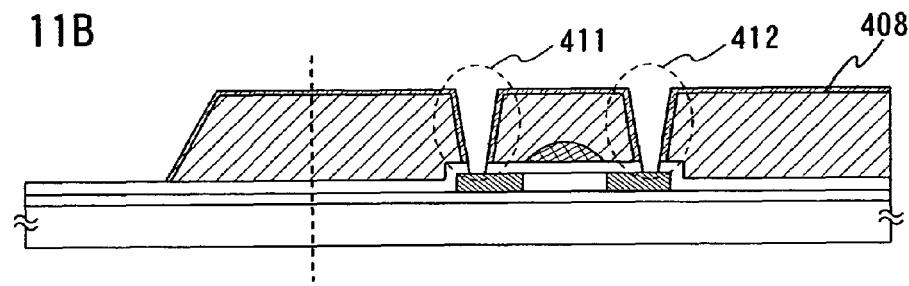

Next, doping treatment of an inert element is performed to form a highly densified portion 408 on the surface of the insulating film (FIG. 11B). The doping treatment may be performed by ion doping or ion implantation. Typically, argon (Ar) is used as the inert element. Distortion is given by adding the inert element with a comparatively large atomic radius to reform a surface (including a side wall) or to highly densify for preventing the entry of moisture or oxygen. The inert element contained in the highly densified portion is within the concentration range of from $1\times10^{19}/cm^3$ to $5\times10^{21}/cm^3$, typically, from $2\times10^{19}/cm^3$ to $2\times10^{21}/cm^3$. In addition, the openings are formed to have a tapered shape so that an inert element is doped on a surface (including a side) of the openings 411 and 412. It is desirable to set the taper angle θ more than 30° and less than 75°.

Figure 11C:
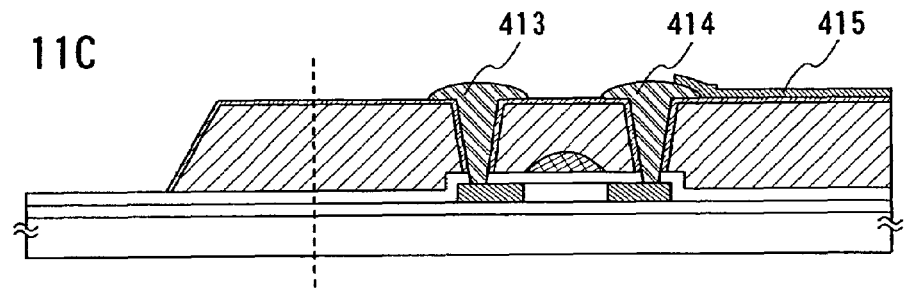

Then, openings 411 and 412 are filled with a conductive material by discharging a composition to form conductive films 413 and 414. Subsequently, a conductive film 415 which functions as a first electrode (a pixel electrode) is formed by using a droplet discharging method (FIG. 11C). When an anode is formed as the first electrode, it is preferable to use a material having a comparatively high work function.

Then, an insulator (also referred to as a bank, a partition wall, a barrier, or the like) 416 which covers an end portion of the first electrode is formed, and an electroluminescent layer 417 is formed so as to be in contact with the conductive film 415. Then, a conductive film 418 is laminated so as to be in contact with the electroluminescent layer 417. Then, a light emitting element including the conductive film 415, the electroluminescent element 417 and the conductive film 418 is completed. Finally, an insulating layer 419 which functions as a protective film is formed over the entire surface.

Figure 11D:
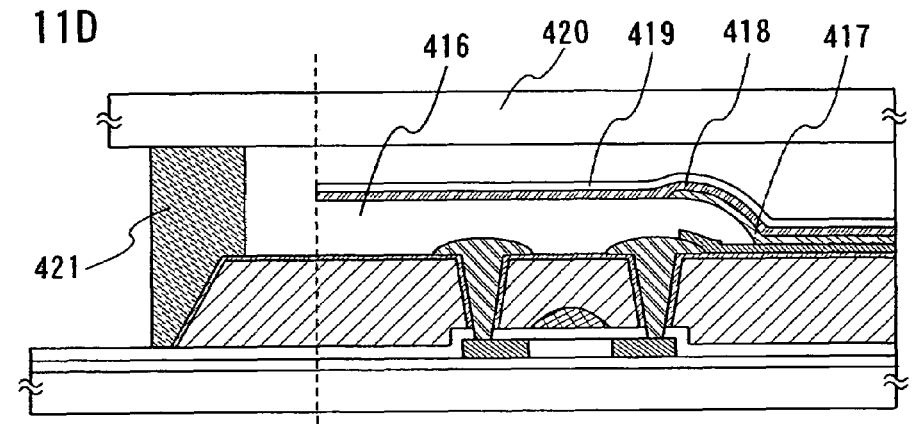

Subsequently, a sealant 421 is formed by a screen printing method or a dispenser method, and a substrate 420 is attached to the substrate 400 with the sealant. Through the above-mentioned steps, a semiconductor device including a light emitting element as shown in FIG. 11D is completed.

Either an analog video signal or a digital video signal may be used for the above-mentioned semiconductor device including a light emitting element. However, when a digital video signal is used, driving system differs according to using voltage or current for the video signal. In other words, when light is emitted from a light emitting element, there are two kinds of driving system in video signals inputted into a pixel; driving system with constant voltage and driving system with constant current. Further, there are two kinds of driving system using video signals with constant voltage: driving system in which voltage applied to a light emitting element is constant, and driving system in which current applied to a light emitting element is constant. In addition, there are two kinds of the driving system using video signals with constant current: driving system in which voltage applied to a light emitting element is constant, and driving system in which current applied to a light emitting element is constant. The driving system in which voltage applied to a light emitting element is constant voltage drive, and the driving system in which current applied to a light emitting element is constant is constant current drive. In the constant current drive, constant current flows regardless of variation in resistance of a light emitting element. Either driving system using a voltage video signal or a driving system using a current video signal may be used for a semiconductor device completed by the invention, and either constant voltage drive or constant current drive may be used. This embodiment can be freely combined with the above-mentioned embodiment mode and embodiments.

Embodiment 3

Figure 12A:
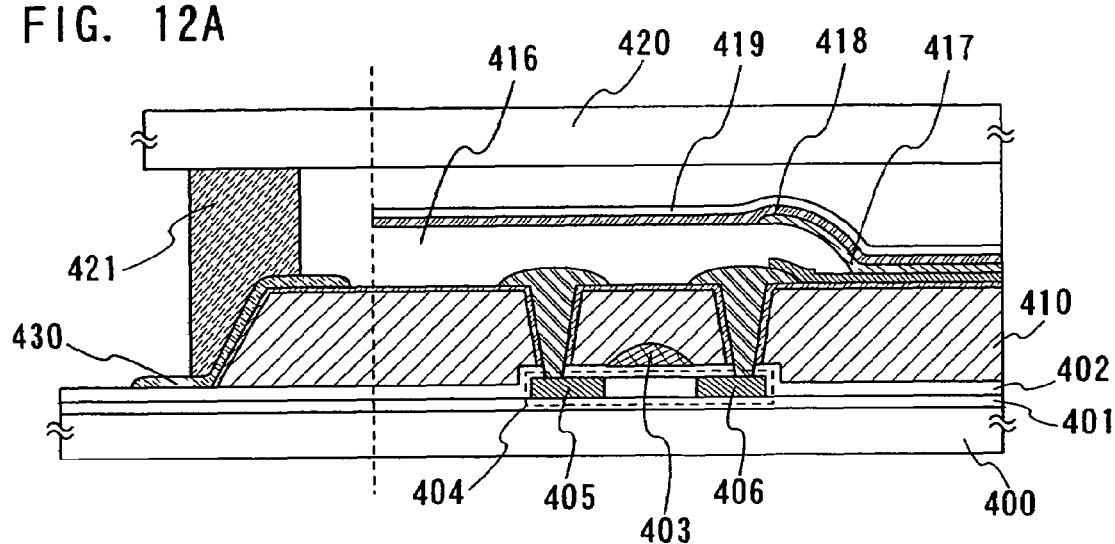
FIGS. 12A and 12B are diagram to explain a method for manufacturing a semiconductor device (Embodiment 3).
Figure 12B:
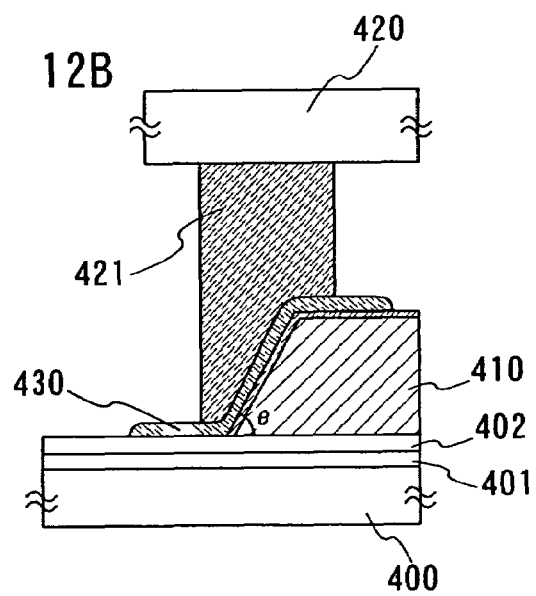

In this embodiment, an example in which an end portion is covered with a metal layer is shown in FIGS. 12A and 12B. Detail description is omitted here since a portion other than a circumference is same as FIG. 11D shown in embodiment 2. Note that, in FIGS. 12A and 12B, the identical portions are denoted by the same signs with those of as FIGS. 11A to 11D.

In this embodiment, a barrier layer 430 is formed by discharging a composition over an end portion of an interlayer insulating film 410 as shown in FIGS. 12A and 12B. A composition which has characteristics to prevent the entry of moisture or oxygen, and has the viscosity of 50 cp or less so that the barrier layer 430 can be formed by a droplet discharging method, may be used here. As the composition having these characteristics, for example, a known conductive material, or a resin material such as an epoxy resin, an acrylic resin, a phenol resin, a novolac resin, a melamine resin, or an urethane resin is used. When these resin materials are used, the viscosity may be adjusted by dissolving or dispersing the resin materials with a solvent. In addition, a resin that is liquid repellent is preferable, and for example, a resin including a fluorine atom, a resin configured by only hydrocarbon can be given. In more detail, a resin including a monomer which contains a fluorine atom within a molecule, or a resin including a monomer which is configured by only a carbon atom and a hydrogen atom can be given as an example.

When the barrier layer 430 is formed from a conductive material, it is necessary that the barrier layer 430 is formed without generating a short circuit with a wiring. Hence, in a region having a possibility of generating a short circuit with a wiring, it is preferable to form the barrier layer 430 from a resin material. An enlarged cross-sectional view of a circumference is shown in FIG. 12B. In the insulating film 410, a side surface of an end portion having a step is covered with the barrier layer 430. Here, there is a possibility that disconnection due to a step occurs according to an angle of an end portion at the time of forming the barrier layer 430. Hence, it is necessary that an end portion is formed to have a gentle inclined surface. Specifically, the side surface may be formed to be a tapered shape of from 30° to 75°. Moreover, in order to prevent disconnection due to a step, treatment of baking the composition after discharging one drop or plural drops, and curing a composition may be performed.

As described above, moisture, oxygen or the like is prevented from entering an insulator which is directly in contact with a light emitting element by forming a barrier layer over an insulating film; therefore, deterioration of a light emitting element can be prevented. Hence, a dark spot or a shrink is not generated, which results in being able to provide a semiconductor device in which reliability as a product is improved. Note that this embodiment can be freely combined with embodiment mode and other embodiments.

Embodiment 4

In this embodiment, in a manufacturing step of a top gate type thin film transistor using a polycrystalline semiconductor (polysilicon, p-Si), a method for manufacturing a semiconductor device in which the present invention is applied to a method for manufacturing an insulating layer disposed between a conductive material in contact with an impurity region included in the thin film transistor, and a gate electrode, is described with reference to FIGS. 10A to 10D.

Initially, a semiconductor is formed over a substrate 150, and after forming an insulating film 151 over the semiconductor, conductive films 164 to 166 are formed over the insulating film 151 by a droplet discharging method. In addition, entry of impurities from the substrate 150 may be prevented by forming an insulating film which is to be a base film over the substrate 150, if necessary. Then, impurities are added to the semiconductor by using conductive films 164 to 166 as masks to form impurity regions 155 to 160 in which impurities are added, and channel forming regions 152 to 154 (FIG. 10A).

Then, after forming an insulating film 177 by a droplet discharging method, a mask formed of an insulating film which is different from the insulating film 177 is further formed to fabricate openings 171 to 176 by etching a part of the insulating film 177 which is not covered with the mask (FIG. 10B). Then, conductive films 181 to 186 are formed so as to fill the openings 171 to 176 by selectively discharging a composition including a conductive material. Through above-mentioned steps, a semiconductor device shown in FIG. 10C can be manufactured. Note that the insulating film 177 and conductive films 181 to 186 may be manufactured by using a material shown in the above-mentioned embodiment mode or embodiments.

By laminating layers from a second layer to a fifth layer by repeating the above-mentioned steps, a semiconductor device having multi-layer wirings as shown in FIG. 10D is completed.

A semiconductor device having a multi-layer wirings structure in which multiple wirings are laminated as shown in FIG. 10D is very effective when a number of functional circuits such as a CPU (a central processing unit), an image processing circuit, and a memory are required to be incorporated. In addition, by applying a multi-layer wirings structure, a wiring is not required to be led in the same layer as a gate electrode, a source wiring, or a drain wiring of a semiconductor element formed in the first layer, thereby being highly effective in miniaturization and weight saving of a semiconductor device.

Furthermore, the more layers are laminated, the more a manufacturing process is simplified; thus manufacturing at low cost becomes possible in compared with the conventional manufacturing method, by forming a wiring layer with a droplet discharging method.

Note that this embodiment can be freely combined with the above-mentioned embodiment mode and embodiments.

Embodiment 5

Figure 13:
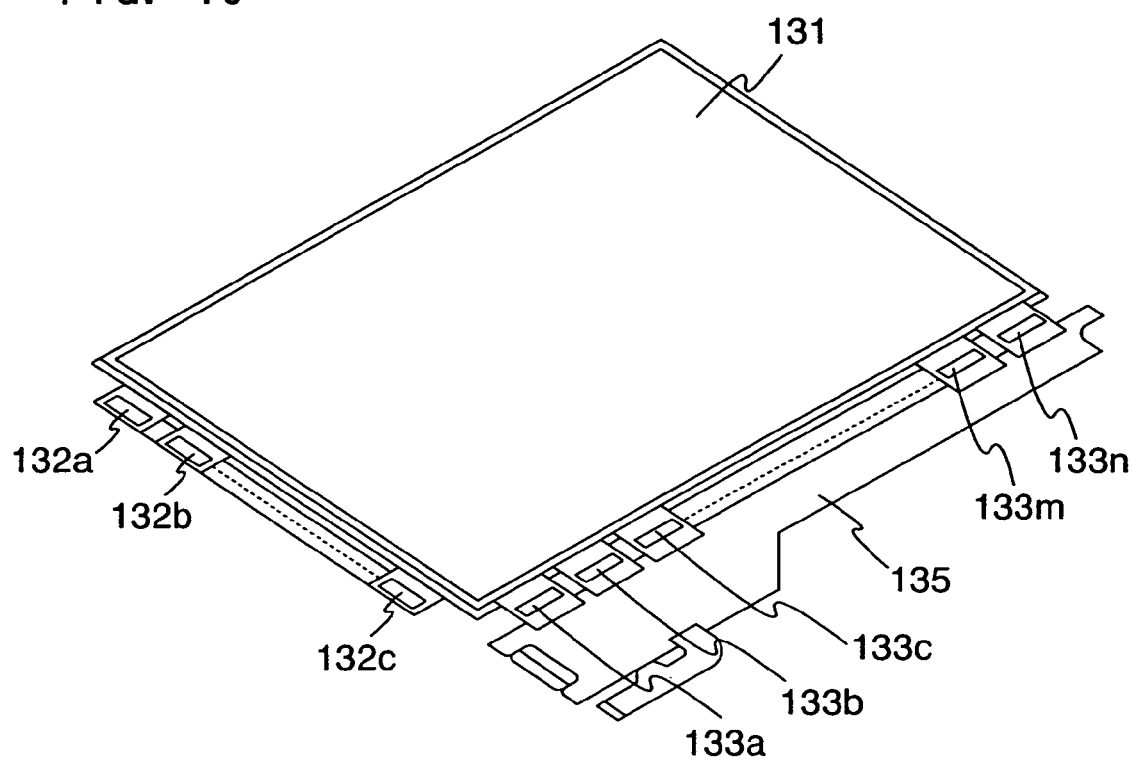
FIG. 13 is a diagram of a panel, which is a form of a semiconductor device to which the invention is applied (Embodiment 5).

FIG. 13 is used to describe a state in which a liquid crystal display panel or an EL display panel in Embodiment 1 and Embodiment 2 is modularized.

A panel shown in Embodiment 1 or Embodiment 2 (FIGS. 8A to 8C, FIGS. 9A to 9E or FIGS. 11A to 11D) is mounted with an electric circuit system such as a driver LSI, a controller and a gradation drive voltage generation circuit for driving and controlling liquid crystal and EL. Among electric circuits, a signal processing system and a control system are disposed over a printed-circuit board (a PCB) and a driver IC group is mounted at a periphery of a pixel portion. As a mounting method, either a TAB (Tape Automated Bonding) method which mounts a TCP (tape carrier package) type driver, or a COG (Chip On Glass) method which direct-mounts a bare chip of a driver LSI on a panel may be used.

FIG. 13 shows the case of being mounted with a TAB method. The pixel portion 131 may be a pixel portion in which liquid crystal is used as an indication medium, or a pixel portion in which an EL element is used as indication medium as shown in Embodiment 1 or Embodiment 2. As driver ICs 132a, 132b to 132n, 133a, 133b, 133c to 133m and 133n, in addition to integrated circuits formed by using a single crystal semiconductor, a similar type among TFTs in which a polycrystalline semiconductor is used may be used. In addition, among the electric circuits, a signal processing system and a control system are disposed over a printed-circuit board 135.

The above-mentioned panel may be mounted by a COG method, and a driver IC is directly mounted over a panel and a connection terminal from external can be decreased. In this case, peripheral drive circuits are formed over a substrate to be integrated, and as an element configuring these, a transistor having a p-Si type semiconductor as a channel portion may be used. This is effective when a pixel portion and a driver circuit portion are formed to be integrated with the p-Si type semiconductor.

Additionally, a transistor in which a semi-amorphous semiconductor (hereinafter, referred to as an SAS) serves as a channel portion may be also used. A transistor in which an SAS functions as a channel portion has higher mobility than that of a transistor in which an amorphous semiconductor (a-Si) serves as a channel portion, and has sufficient characteristics to configure a driver circuit.

Note that this embodiment can be freely combined with the above-mentioned embodiment mode and embodiments.

Embodiment 6

Various electronic devices can be completed by using the module described in Embodiment 5. A specific example thereof is described with reference to FIGS. 14A to 14C.

Figure 14A:
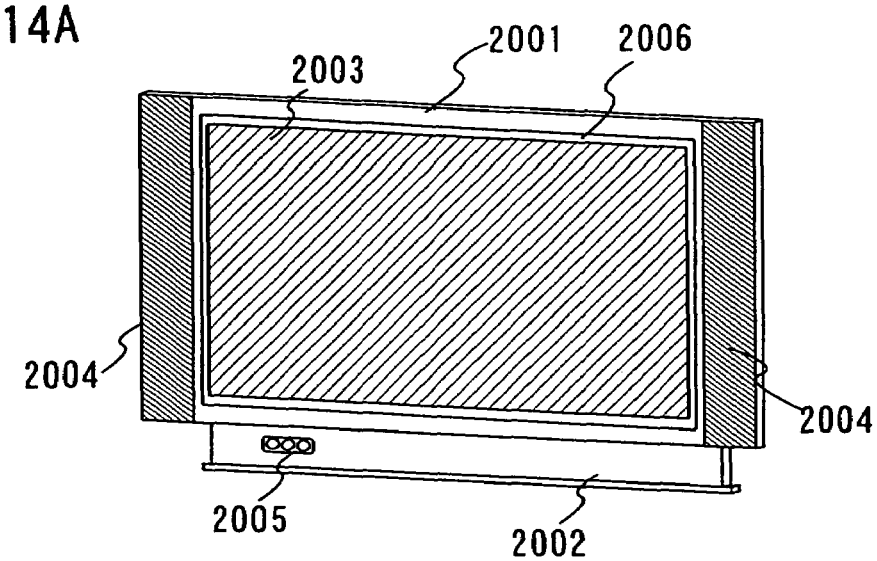
FIGS. 14A to 14C are diagrams to show electronic devices to which the invention to be applied (Embodiment 6).

FIG. 14A illustrates a display device which includes a casing 2001, a support base 2002, a display portion 2003, speaker portions 2004, video input terminals 2005 and the like. In this display device, a display module 2006 using the liquid crystal or the EL element shown in Embodiment 5 is incorporated in the casing 2001. In addition, the display device is manufactured by adopting a semiconductor device having a wiring structure formed by a manufacturing method shown in embodiments to the display portion 2003. By using the manufacturing method of the present invention, the invention can be applied to an electronic device having a large size without using large apparatus since a manufacturing process is simplified. Accordingly, a display device having a large size can be manufactured at the low cost. The liquid crystal display device, the light emitting device and the like shown in Embodiment 1 or Embodiment 2 are included in a display device. Specifically, display devices for displaying information such as display devices for a personal computer, TV broadcast reception, advertisement display are all included in a display device.

Figure 14B:
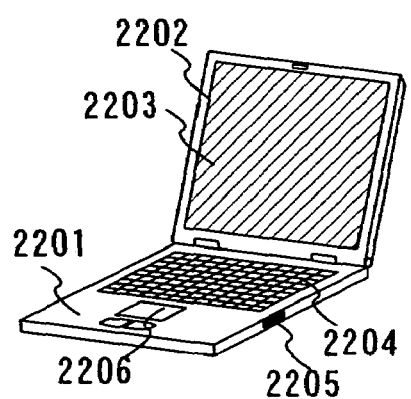

FIG. 14B illustrates a computer which includes a casing 2201, a display portion 2203, a key board 2204, an external connection port 2205, a pointing mouse 2206 and the like. The invention can be applied to fabricating the display portion 2203. The invention is also applicable to a semiconductor device such as a CPU inside of a main body and a memory. A computer can be miniaturized and made lightweight by forming multi-layer wirings as shown in Embodiment 4 (FIGS. 10A to 10D).

Figure 14C:
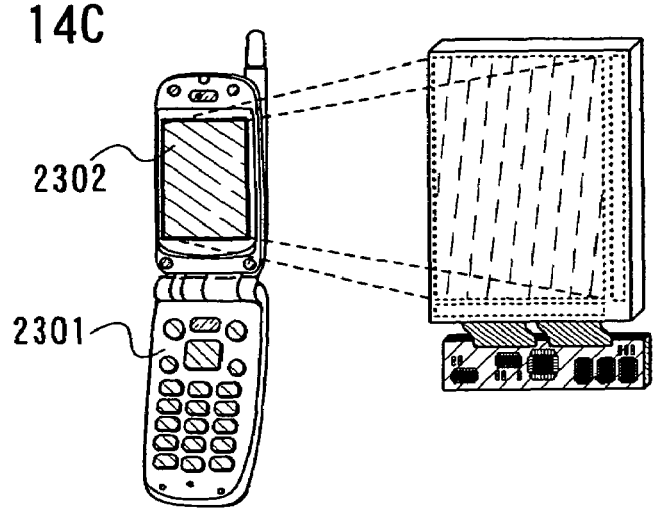

FIG. 14C illustrates a cellular phone among portable terminals which includes a casing 2301, a display portion 2302 and the like. Electronic devices such as the above-mentioned cellular phone and other PDAs and digital cameras are portable terminals. Therefore, they have small image displays. Hence, it is preferable to attempt miniaturization and weight saving of a cellular phone by forming a drive circuit using a thin film transistor by using a polycrystalline semiconductor as a channel, the multi-layer wirings shown in Embodiment 4, or a functional circuit such as a CPU over the same substrate as the display portion as shown Embodiment 5.

As described above, a semiconductor device manufactured according to the invention has extremely wide application range, and is applicable to electronic devices in all field. Note that electronic devices in Embodiment 6 can be completed by using a semiconductor device manufactured by practicing embodiment mode 1 to 5 and embodiments 1 to 5.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

This application is based on Japanese Patent Application serial no. 2003-367051 filed in Japan Patent Office on Oct. 28, 2003, the contents of which are hereby incorporated by reference.

The invention claimed is:

1. A method for manufacturing a semiconductor device, comprising the steps of:
   forming a first insulating film by selectively discharging a composition including an insulator;
   forming a second insulating film over the first insulating film;
   performing light-exposure and development on the second insulating film to form a mask pattern;
   forming an opening by etching the first insulating film by using the mask pattern; and
   forming a barrier layer by selectively discharging a composition to at least a side surface of the opening.

2. The method for manufacturing a semiconductor device according to claim 1, wherein the opening formed in the first insulating film having a tapered shape, and an inert element is added to the first insulating film.

3. The method for manufacturing a semiconductor device according to claim 2, wherein the inert element is one or plural kinds selected from helium (He), neon (Ne), argon (Ar), krypton (Kr) and xenon (Xe).

4. The method for manufacturing a semiconductor device according to claim 1, wherein an insert element is added to the first insulating film before forming the barrier layer.

5. The method for manufacturing a semiconductor device according to claim 1, wherein a conductive film is formed by discharging a composition over the opening, and wherein a barrier layer is formed by selectively discharging a composition over the conductive film.

6. The method for manufacturing a semiconductor device according to claim 5, wherein the barrier layer comprises a resin including a monomer which comprises a fluorine atom within a molecule, or a resin including a monomer which comprises only a carbon atom and a hydrogen atom.

7. The method for manufacturing a semiconductor device according to claim 1, wherein the barrier layer comprises a resin including a monomer which comprises a fluorine atom within a molecule, or a resin including a monomer which comprises only a carbon atom and a hydrogen atom.

8. The method for manufacturing a semiconductor device according to claim 1, wherein the barrier layer comprises a resin including a monomer which comprises a fluorine atom within a molecule, or a resin including a monomer which comprises only a carbon atom and a hydrogen atom.

9. The method for manufacturing a semiconductor device according to claim 1, wherein the first insulating film comprises a material in which a skeletal structure is configured by the bond of silicon and oxygen.

10. The method for manufacturing a semiconductor device according to claim 1, wherein the first insulating film comprises one or plural kinds selected from polyimide, acrylic, benzocyclobutene and polyamide.

11. The method for manufacturing a semiconductor device according to claim 1, wherein the first insulating film is formed so that the inert gas is included at a concentration of from $1 \times 10^{19}$ atoms/cm$^3$ to $5 \times 10^{21}$ atoms/cm$^3$.

12. The method for manufacturing a semiconductor device according to claim 1, wherein planarizing treatment is performed after forming the first insulating film by discharging a composition comprising an insulator.

13. The method for manufacturing a semiconductor device according to claim 1, wherein a conductive film which fills the opening is formed by discharging a composition including a conductive material to the opening of the first insulating film.

14. The method for manufacturing a semiconductor device according to claim 13, wherein the conductive film comprises a material including silver, gold, copper or indium tin oxide.

15. The method for manufacturing a semiconductor device according to claim 1, wherein the opening formed in the first insulating film having a tapered shape.

16. The method for manufacturing a semiconductor device according to claim 1, wherein an inert element is added the first insulating film.

17. The method of manufacturing an electronic device comprising incorporating into the semiconductor device according to claim 1, wherein the semiconductor device includes a display device, a computer, a cellular phone, a PDA, a camera, or the like.

18. A method for manufacturing a semiconductor device, comprising the steps of:

forming a first insulating film by selectively discharging a composition including an insulator;

forming a second insulating film as a mask pattern by selectively discharging a composition over the first insulating film;

forming an opening by etching the first insulating film by using the mask pattern; and forming a barrier layer by selectively discharging a composition to at least a side surface of the opening.

19. The method for manufacturing a semiconductor device according to claim 18, wherein the opening formed in the first insulating film having a tapered shape, and an inert element is added to the first insulating film.

20. The method for manufacturing a semiconductor device according to claim 19, wherein the inert element is one or plural kinds selected from helium (He), neon (Ne), argon (Ar), krypton (Kr) and xenon (Xe).

21. The method for manufacturing a semiconductor device according to claim 18, wherein an insert element is added to the first insulating film before forming the barrier layer.

22. The method for manufacturing a semiconductor device according to claim 18, wherein a conductive film is formed by discharging a composition over the opening, and wherein a barrier layer is formed by selectively discharging a composition over the conductive film.

23. The method for manufacturing a semiconductor device according to claim 22, wherein the barrier layer comprises a resin including a monomer which comprises a fluorine atom within a molecule, or a resin including a monomer which comprises only a carbon atom and a hydrogen atom.

24. The method for manufacturing a semiconductor device according to claim 18, wherein the first insulating film comprises one or plural kinds selected from polyimide, acrylic, benzocyclobutene and polyamide.

25. The method for manufacturing a semiconductor device according to claim 18, wherein the first insulating film comprises a material in which a skeletal structure is configured by the bond of silicon and oxygen.

26. The method for manufacturing a semiconductor device according to claim 18, wherein the first insulating film is formed so that the inert gas is included at a concentration of from $1 \times 10^{19}$ atoms/cm$^3$ to $5 \times 10^{21}$ atoms/cm$^3$.

27. The method for manufacturing a semiconductor device according to claim 18, wherein planarizing treatment is performed after forming the first insulating film by discharging a composition comprising an insulator.

28. The method for manufacturing a semiconductor device according to claim 18, wherein a conductive film which fills the opening is formed by discharging a composition including a conductive material to the opening of the first insulating film.

29. The method for manufacturing a semiconductor device according to claim 28, wherein the conductive film comprises a material including silver, gold, copper or indium tin oxide.

30. The method for manufacturing a semiconductor device according to claim 18, wherein the opening formed in the first insulating film having a tapered shape.

31. The method for manufacturing a semiconductor device according to claim 18, wherein an inert element is added the first insulating film.

32. The method of manufacturing an electronic device comprising incorporating into the semiconductor device according to claim 18, wherein the semiconductor device includes a display device, a computer, a cellular phone, a PDA, a camera, or the like.

33. A method for manufacturing a semiconductor device, comprising the steps of:

forming a first insulating film by selectively discharging a composition over a thin film transistor, the composition including an insulator;

forming a second insulating film over the first insulating film;

performing light-exposure and development on the second insulating film to form a mask pattern;

forming at least one opening by etching the first insulating film by using the mask pattern wherein the opening reaches one of source and drain regions of the thin film transistor;

adding an inert element to the first insulating film; and forming a conductive layer over the first insulating film wherein the conductive layer is connected to the one of the source and drain regions through the opening.

34. The method for manufacturing a semiconductor device according to claim 33, wherein the conductive layer is formed by discharging.

35. The method for manufacturing a semiconductor device according to claim 33, wherein the opening formed in the first insulating film having a tapered shape, and an inert element is added to the first insulating film.

36. The method for manufacturing a semiconductor device according to claim 35, wherein the inert element is one or plural kinds selected from helium (He), neon (Ne), argon (Ar), krypton (Kr) and xenon (Xe).

37. The method for manufacturing a semiconductor device according to claim 33, wherein a barrier layer is formed by selectively discharging a composition to a side surface of the opening.

38. The method for manufacturing a semiconductor device according to claim 37, wherein the barrier layer comprises a resin including a monomer which comprises a fluorine atom within a molecule, or a resin including a monomer which comprises only a carbon atom and a hydrogen atom.

39. The method for manufacturing a semiconductor device according to claim 33, wherein a conductive film is formed by discharging a composition over the opening, and wherein a barrier layer is formed by selectively discharging a composition over the conductive film.

40. The method for manufacturing a semiconductor device according to claim 39, wherein the barrier layer comprises a resin including a monomer which comprises a fluorine atom within a molecule, or a resin including a monomer which comprises only a carbon atom and a hydrogen atom.

41. The method for manufacturing a semiconductor device according to claim 33, wherein the first insulating film comprises one or plural kinds selected from polyimide, acrylic, benzocyclobutene and polyamide.

42. The method for manufacturing a semiconductor device according to claim 33, wherein the first insulating film comprises a material in which a skeletal structure is configured by the bond of silicon and oxygen.

43. The method for manufacturing a semiconductor device according to claim 33, wherein the first insulating film is formed so that the inert gas is included at a concentration of from $1\times10^{19}$ atoms/cm$^3$ to $5\times10^{21}$ atoms/cm$^3$.

44. The method for manufacturing a semiconductor device according to claim 33, wherein planarizing treatment is performed after forming the first insulating film by discharging a composition comprising an insulator.

45. The method for manufacturing a semiconductor device according to claim 33, wherein a conductive film which fills the opening is formed by discharging a composition including a conductive material to the opening of the first insulating film.

46. The method for manufacturing a semiconductor device according to claim 45, wherein the conductive film comprises a material including silver, gold, copper or indium tin oxide.

47. The method for manufacturing a semiconductor device according to claim 33, wherein the opening formed in the first insulating film having a tapered shape.

48. The method for manufacturing a semiconductor device according to claim 33, wherein an inert element is added the first insulating film.

49. The method of manufacturing an electronic device comprising incorporating into the semiconductor device according to claim 33, wherein the semiconductor device includes a display device, a computer, a cellular phone, a PDA, a camera, or the like.

50. A method for manufacturing a semiconductor device, comprising the steps of:

forming a first insulating film by selectively discharging a composition over a thin film transistor, the composition including an insulator;

forming a second insulating film over the first insulating film;

performing light-exposure and development on the second insulating film to form a mask pattern;

forming at least one opening by etching the first insulating film by using the mask pattern wherein the opening reaches one of source electrode and drain electrode of the thin film transistor;

adding an inert element to the first insulating film; and forming a conductive layer over the first insulating film wherein the conductive layer is connected to the one of the source electrode and drain electrode through the opening.

51. The method for manufacturing a semiconductor device according to claim 50 wherein the conductive layer is formed by discharging.

52. The method for manufacturing a semiconductor device according to claim 50, wherein the opening formed in the first insulating film having a tapered shape, and an inert element is added to the first insulating film.

53. The method for manufacturing a semiconductor device according to claim 52, wherein the inert element is one or plural kinds selected from helium (He), neon (Ne), argon (Ar), krypton (Kr) and xenon (Xe).

54. The method for manufacturing a semiconductor device according to claim 50, wherein a barrier layer is formed by selectively discharging a composition to a side surface of the opening.

55. The method for manufacturing a semiconductor device according to claim 54, wherein the barrier layer comprises a resin including a monomer which comprises a fluorine atom within a molecule, or a resin including a monomer which comprises only a carbon atom and a hydrogen atom.

56. The method for manufacturing a semiconductor device according to claim 50, wherein a conductive film is formed by discharging a composition over the opening, and wherein a barrier layer is formed by selectively discharging a composition over the conductive film.

57. The method for manufacturing a semiconductor device according to claim 56, wherein the barrier layer comprises a resin including a monomer which comprises a fluorine atom within a molecule, or a resin including a monomer which comprises only a carbon atom and a hydrogen atom.

58. The method for manufacturing a semiconductor device according to claim 50, wherein the first insulating film comprises a material in which a skeletal structure is configured by the bond of silicon and oxygen.

59. The method for manufacturing a semiconductor device according to claim 50, wherein the first insulating film is formed so that the inert gas is included at a concentration of from $1\times10^{19}$ atoms/cm$^3$ to $5\times10^{21}$ atoms/cm$^3$.

60. The method for manufacturing a semiconductor device according to claim 50, wherein planarizing treatment is performed after forming the first insulating film by discharging a composition comprising an insulator.

61. The method for manufacturing a semiconductor device according to claim 50, wherein a conductive film which fills the opening is formed by discharging a composition including a conductive material to the opening of the first insulating film.

62. The method for manufacturing a semiconductor device according to claim 61, wherein the conductive film comprises a material including silver, gold, copper or indium tin oxide.

63. The method for manufacturing a semiconductor device according to claim 50, wherein the opening formed in the first insulating film having a tapered shape.

64. The method for manufacturing a semiconductor device according to claim 50, wherein the first insulating film comprises one or plural kinds selected from polyimide, acrylic, benzocyclobutene and polyamide.

65. The method for manufacturing a semiconductor device according to claim 50, wherein an inert element is added the first insulating film.

66. The method of manufacturing an electronic device comprising incorporating into the semiconductor device according to claim 50, wherein the semiconductor device includes a display device, a computer, a cellular phone, a PDA, a camera, or the like.

67. A method for manufacturing a semiconductor device, comprising the steps of:
forming a first insulating film by selectively discharging a composition over a thin film transistor, the composition including an insulator;
forming a second insulating film over the first insulating film;
performing light-exposure and development on the second insulating film to form a mask pattern;
forming at least one opening by etching the first insulating film by using the mask pattern wherein the opening reaches one of source and drain regions of the thin film transistor;
adding an inert element to the first insulating film;
forming a conductive layer over the first insulating film wherein the conductive layer is connected to the one of the source and drain regions through the opening; and
forming a pixel electrode electrically connected to the conductive layer.

68. The method for manufacturing a semiconductor device according to claim 67 wherein the conductive layer is formed by discharging.

69. The method for manufacturing a semiconductor device according to claim 67, wherein the opening formed in the first insulating film having a tapered shape, and an inert element is added to the first insulating film.

70. The method for manufacturing a semiconductor device according to claim 69, wherein the inert element is one or plural kinds selected from helium (He), neon (Ne), argon (Ar), krypton (Kr) and xenon (Xe).

71. The method for manufacturing a semiconductor device according to claim 67, wherein a barrier layer is formed by selectively discharging a composition to a side surface of the opening.

72. The method for manufacturing a semiconductor device according to claim 71, wherein the barrier layer comprises a resin including a monomer which comprises a fluorine atom within a molecule, or a resin including a monomer which comprises only a carbon atom and a hydrogen atom.

73. The method for manufacturing a semiconductor device according to claim 67, wherein a conductive film is formed by discharging a composition over the opening, and wherein a barrier layer is formed by selectively discharging a composition over the conductive film.

74. The method for manufacturing a semiconductor device according to claim 73, wherein the barrier layer comprises a resin including a monomer which comprises a fluorine atom within a molecule, or a resin including a monomer which comprises only a carbon atom and a hydrogen atom.

75. The method for manufacturing a semiconductor device according to claim 67, wherein the first insulating film comprises one or plural kinds selected from polyimide, acrylic, benzocyclobutene and polyamide.

76. The method for manufacturing a semiconductor device according to claim 67, wherein the first insulating film comprises a material in which a skeletal structure is configured by the bond of silicon and oxygen.

77. The method for manufacturing a semiconductor device according to claim 67, wherein the first insulating film is formed so that the inert gas is included at a concentration of from $1\times10^{19}$ atoms/cm$^3$ to $5\times10^{21}$ atoms/cm$^3$.

78. The method for manufacturing a semiconductor device according to claim 67, wherein planarizing treatment is performed after forming the first insulating film by discharging a composition comprising an insulator.

79. The method for manufacturing a semiconductor device according to claim 67, wherein a conductive film which fills the opening is formed by discharging a composition including a conductive material to the opening of the first insulating film.

80. The method for manufacturing a semiconductor device according to claim 79, wherein the conductive film comprises a material including silver, gold, copper or indium tin oxide.

81. The method for manufacturing a semiconductor device according to claim 67, wherein the opening formed in the first insulating film having a tapered shape.

82. The method for manufacturing a semiconductor device according to claim 67, wherein an inert element is added the first insulating film.

83. The method of manufacturing an electronic device comprising incorporating into the semiconductor device according to claim 67, wherein the semiconductor device includes a display device, a computer, a cellular phone, a PDA, a camera, or the like.

84. A method for manufacturing a semiconductor device, comprising the steps of:
forming a first insulating film by selectively discharging a composition over a thin film transistor, the composition including an insulator;
forming a second insulating film over the first insulating film;
performing light-exposure and development on the second insulating film to form a mask pattern;
forming at least one opening by etching the first insulating film by using the mask pattern wherein the opening reaches one of source electrode and drain electrode of the thin film transistor;
adding an inert element to the first insulating film;
forming a conductive layer over the first insulating film wherein the conductive layer is connected to the one of the source electrode and drain electrode through the opening; and forming a pixel electrode electrically connected to the conductive layer.

85. The method for manufacturing a semiconductor device according to claim 84 wherein the conductive layer is formed by discharging.

86. The method for manufacturing a semiconductor device according to claim 84, wherein the opening formed in the first insulating film having a tapered shape, and an inert element is added to the first insulating film.

87. The method for manufacturing a semiconductor device according to claim 86, wherein the inert element is one or plural kinds selected from helium (He), neon (Ne), argon (Ar), krypton (Kr) and xenon (Xe).

88. The method for manufacturing a semiconductor device according to claim 84, wherein a barrier layer is formed by selectively discharging a composition to a side surface of the opening.

89. The method for manufacturing a semiconductor device according to claim 88, wherein the barrier layer comprises a resin including a monomer which comprises a fluorine atom within a molecule, or a resin including a monomer which comprises only a carbon atom and a hydrogen atom.

90. The method for manufacturing a semiconductor device according to claim 84, wherein a conductive film is formed by discharging a composition over the opening, and wherein a barrier layer is formed by selectively discharging a composition over the conductive film.

91. The method for manufacturing a semiconductor device according to claim 90, wherein the barrier layer comprises a resin including a monomer which comprises a fluorine atom within a molecule, or a resin including a monomer which comprises only a carbon atom and a hydrogen atom.

92. The method for manufacturing a semiconductor device according to claim 84, wherein the first insulating film comprises one or plural kinds selected from polyimide, acrylic, benzocyclobutene and polyamide.

93. The method for manufacturing a semiconductor device according to claim 84, wherein the first insulating film comprises a material in which a skeletal structure is configured by the bond of silicon and oxygen.

94. The method for manufacturing a semiconductor device according to claim 84, wherein the first insulating film is formed so that the inert gas is included at a concentration of from $1 \times 10^{19}$ atoms/cm$^3$ to $5 \times 10^{21}$ atoms/cm$^3$.

95. The method for manufacturing a semiconductor device according to claim 84, wherein planarizing treatment is performed after forming the first insulating film by discharging a composition comprising an insulator.

96. The method for manufacturing a semiconductor device according to claim 84, wherein a conductive film which fills the opening is formed by discharging a composition including a conductive material to the opening of the first insulating film.

97. The method for manufacturing a semiconductor device according to claim 96, wherein the conductive film comprises a material including silver, gold, copper or indium tin oxide.

98. The method for manufacturing a semiconductor device according to claim 84, wherein the opening formed in the first insulating film having a tapered shape.

99. The method for manufacturing a semiconductor device according to claim 84, wherein an inert element is added the first insulating film.

100. The method of manufacturing an electronic device comprising incorporating into the semiconductor device according to claim 84, wherein the semiconductor device includes a display device, a computer, a cellular phone, a PDA, a camera, or the like.

* * * * *